(12) United States Patent
Chen et al.

(10) Patent No.: US 12,324,229 B2
(45) Date of Patent: Jun. 3, 2025

(54) SEMICONDUCTOR DEVICE STRUCTURE INCLUDING FORKSHEET TRANSISTORS AND METHODS OF FORMING THE SAME

(71) Applicant: TAIWAN SEMICONDUCTOR MANUFACTURING COMPANY, LTD., Hsinchu (TW)

(72) Inventors: Guan-Lin Chen, Hsinchu (TW); Kuo-Cheng Chiang, Hsinchu (TW); Shi Ning Ju, Hsinchu (TW); Jung-Chien Cheng, Hsinchu (TW); Chih-Hao Wang, Hsinchu (TW); Kuan-Lun Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/513,619

(22) Filed: Nov. 19, 2023

(65) Prior Publication Data
US 2024/0162227 A1    May 16, 2024

Related U.S. Application Data

(62) Division of application No. 17/458,730, filed on Aug. 27, 2021, now Pat. No. 11,855,078.

(51) Int. Cl.
| | |
|---|---|
| H01L 27/088 | (2006.01) |
| H01L 21/8234 | (2006.01) |
| H10D 84/01 | (2025.01) |
| H10D 84/03 | (2025.01) |
| H10D 84/83 | (2025.01) |

(52) U.S. Cl.
CPC ........ *H10D 84/83* (2025.01); *H10D 84/0142* (2025.01); *H10D 84/0149* (2025.01); *H10D 84/0151* (2025.01); *H10D 84/038* (2025.01); *H10D 84/0128* (2025.01)

(58) Field of Classification Search
CPC ........... H01L 29/42392; H01L 29/0673; H01L 21/823412; H01L 29/78696
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |

(Continued)

*Primary Examiner* — John A Bodnar
(74) *Attorney, Agent, or Firm* — NZ Carr Law Office

(57) ABSTRACT

A semiconductor device structure, along with methods of forming such, are described. The method includes forming a first dielectric feature between first and the second fin structures, wherein each first and second fin structure includes first semiconductor layers and second semiconductor layers alternatingly stacked and in contact with the first dielectric layer. The method also includes removing the second semiconductor layers so that the first semiconductor layers of the first and second fin structures extend laterally from a first side and a second side of the first dielectric feature, respectively, trimming the first dielectric feature so that the first dielectric feature has a reduced thickness on both first and the second sides, and forming a gate electrode layer to surround each of the first semiconductor layers of the first and second fin structures.

20 Claims, 38 Drawing Sheets

(56) References Cited

U.S. PATENT DOCUMENTS

| | | |
|---|---|---|
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2013/0037889 A1* | 2/2013 | Liao ...................... H01L 29/517 257/411 |
| 2021/0296315 A1* | 9/2021 | Lilak ................. H01L 29/66439 |
| 2021/0407999 A1* | 12/2021 | Huang ................ H01L 27/0688 |

* cited by examiner

SEMICONDUCTOR DEVICE STRUCTURE INCLUDING FORKSHEET TRANSISTORS AND METHODS OF FORMING THE SAME

CROSS-REFERENCE TO RELATED APPLICATIONS

This application is a divisional application of U.S. patent application Ser. No. 17/458,730 filed on Aug. 27, 2021, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge. For example, transistors using nanowire channels have been proposed to achieve increased device density, greater carrier mobility and drive current in a device. As device size reduces, there is a continuous need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
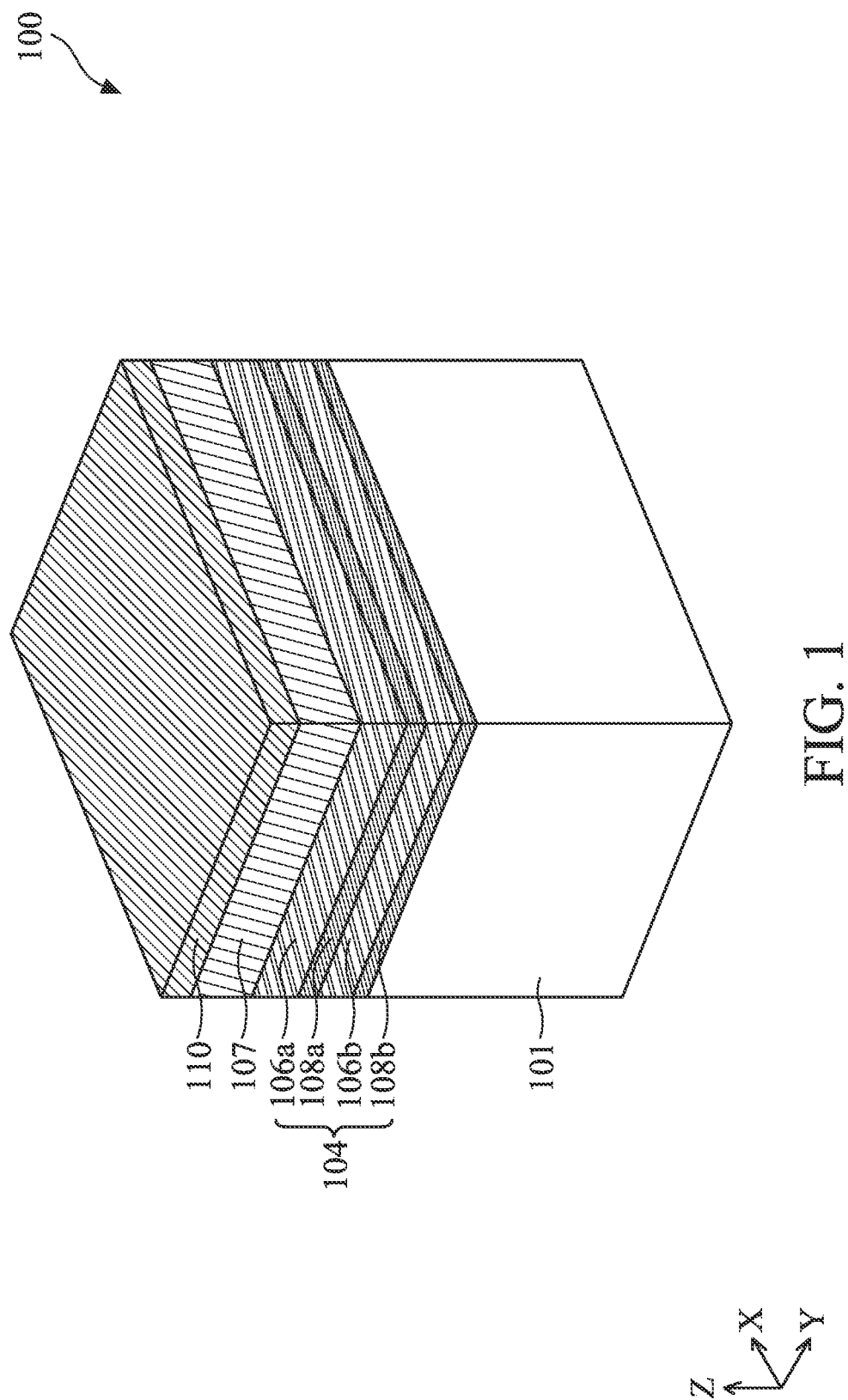
FIGS. 1-4 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure relate to gate all around (GAA) transistors, such as nanosheet FETs, which has a stack of semiconductor layers including first and second semiconductor layers alternatingly formed over a substrate. The first semiconductor layers form nanosheet channel(s) of the transistors. Portions of the second semiconductor layers are removed so that the nanosheet channels (e.g., first semiconductor layers) are wrapped around by a gate electrode. According to embodiments of the present disclosure, one or more nanosheet channels are attached to two opposing sides of a dielectric feature to form a fork-like gate nanosheet transistor, such as a forksheet transistor. Portions of a high-k dielectric layer on the dielectric feature are laterally recessed or removed entirely to allow greater extension of the gate electrode when wrapping around at least three surfaces of each of the first semiconductor layers. As a result, a better control of the nanosheet channels is achieved.

While the embodiments of this disclosure are discussed with respect to nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-24E show exemplary sequential processes for manufacturing a semiconductor device structure 100, in accordance with some embodiments. It is understood that additional operations can be provided before, during, and after processes shown by FIGS. 1-24E, and some of the operations described below can be replaced or eliminated, for additional embodiments of the method. The order of the operations/processes may be interchangeable.

As shown in FIG. 1, a stack of semiconductor layers 104 is formed over a substrate 101. The substrate 101 may be a semiconductor substrate. As shown in FIG. 1, a semiconductor device structure 100 includes the stack of semiconductor layers 104 formed over a front side of the substrate 101. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include various regions that have been doped with impurities (e.g., dopants having p-type or n-type conductivity). Depending on circuit design, the dopants may be, for example boron for an n-type field effect transistor (FET) and phosphorus for a p-type FET.

The stack of semiconductor layers 104 includes alternating semiconductor layers made of different materials to facilitate formation of nanosheet channels in a multi-gate device, such as nanosheet channel FETs or forksheet FETs. In some embodiments, the stack of semiconductor layers 104 includes first semiconductor layers 106 (106a-106b) and second semiconductor layers 108 (108a-108b). In some embodiments, the stack of semiconductor layers 104 includes alternating first and second semiconductor layers 106, 108. The first semiconductor layers 106 are aligned with the second semiconductor layers 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. In some cases, the SiGe in the first or second semiconductor layers 106, 108 can have a germanium composition percentage between about 10% and about 80%. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. For example, at least three surfaces of the nanosheet channel(s) may be surrounded by the gate electrode, and the transistor is a forksheet transistor. The semiconductor device structure 100 may include a nanosheet transistor and/or a forksheet transistor. The nanosheet transistors may be referred to as nanowire transistors, gate-all-around (GAA) transistors, multi-bridge channel (MBC) transistors, or any transistors having the gate electrode surrounding the channels.

It is noted that while two layers of the first semiconductor layers 106 and two layers of the second semiconductor layers 108 are alternately arranged as illustrated in FIG. 1, it is for illustrative purposes and not intended to be limiting beyond what is specifically recited in the claims. It can be appreciated that any number of first and second semiconductor layers 106, 108 can be formed in the stack of semiconductor layers 104; the number of layers depending on the predetermined number of channels for the semiconductor device structure 100. In some embodiments, the number of first semiconductor layers 106, which is the number of channels, is between 3 and 8.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

Figure 12A:
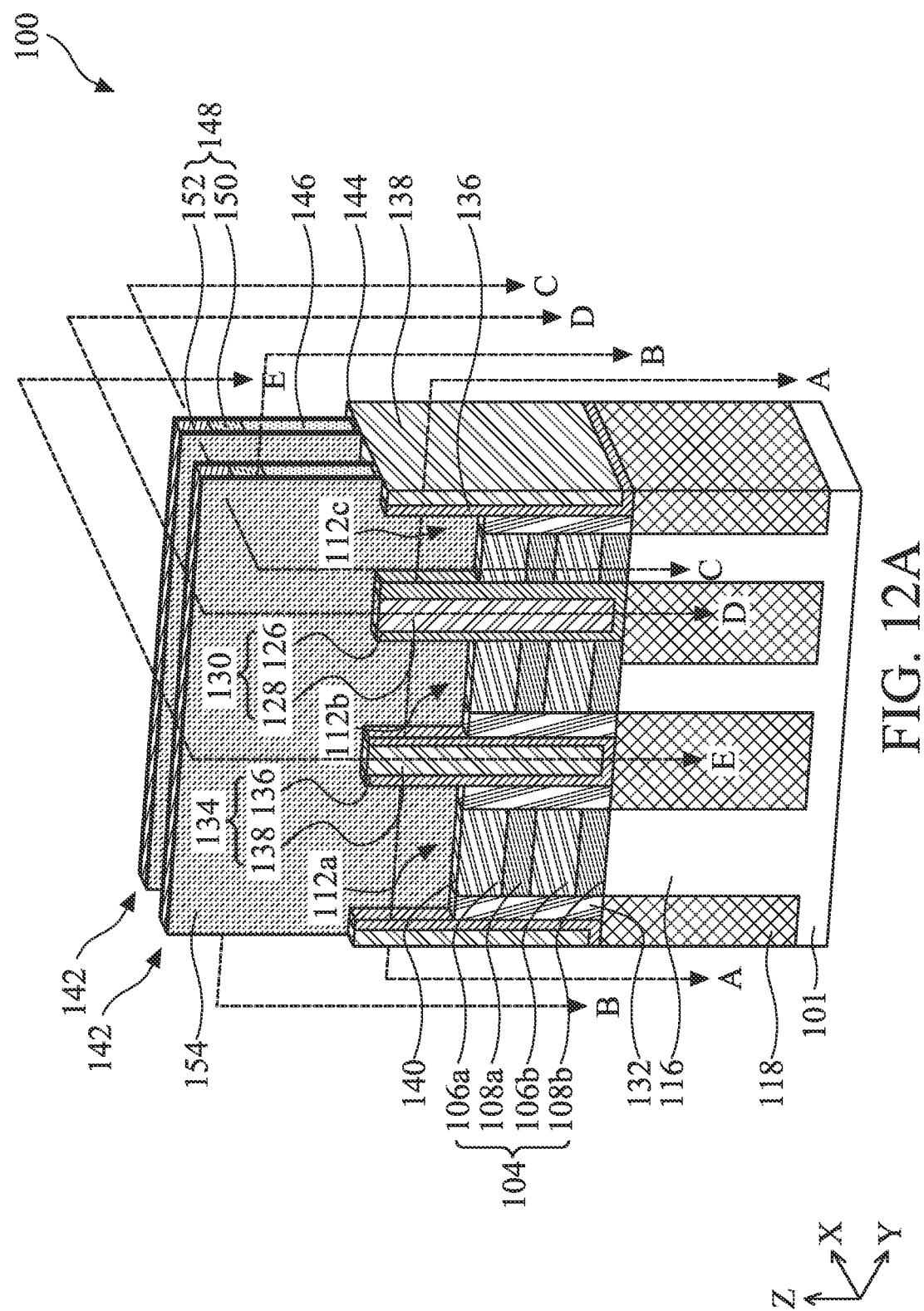
FIG. 12A is a perspective view of one of the various stages of manufacturing the semiconductor device structure, in accordance with some embodiments.

The substrate 101 may include a sacrificial layer 107 on the stack of semiconductor layers 104. The sacrificial layer 107 protects the stack of semiconductor layers 104 during the subsequent processes and is removed along with a portion of a cladding layer (FIG. 10) prior to formation of the sacrificial gate stack (FIG. 12A). In cases where the first semiconductor layer 106 of the stack of semiconductor layers 104 is Si, the sacrificial layer 107 includes SiGe epitaxially grown on the first semiconductor layer 106.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. The second semiconductor layers 108 may eventually be removed and serve to define a vertical distance between adjacent channels for the semiconductor device structure 100. The sacrificial layer 107 may have a thickness that is equal, less, or greater than the thickness of the first semiconductor layer 106. The thickness of the sacrificial layer 107 may range from about 2 nm to 50 nm. The thickness of the first semiconductor layer 106, the second semiconductor layer 108, and the sacrificial layer 107 may vary depending on the application and/or device performance considerations.

A mask structure 110 is formed over the sacrificial layer 107. The mask structure 110 may include an oxygen-containing layer (not shown) and a nitrogen-containing layer (not shown). The oxygen-containing layer may be a pad oxide layer, such as a $SiO_2$ layer. The nitrogen-containing layer may be a pad nitride layer, such as $Si_3N_4$. The mask structure 110 may be formed by any suitable deposition process, such as chemical vapor deposition (CVD) process.

Figure 2:
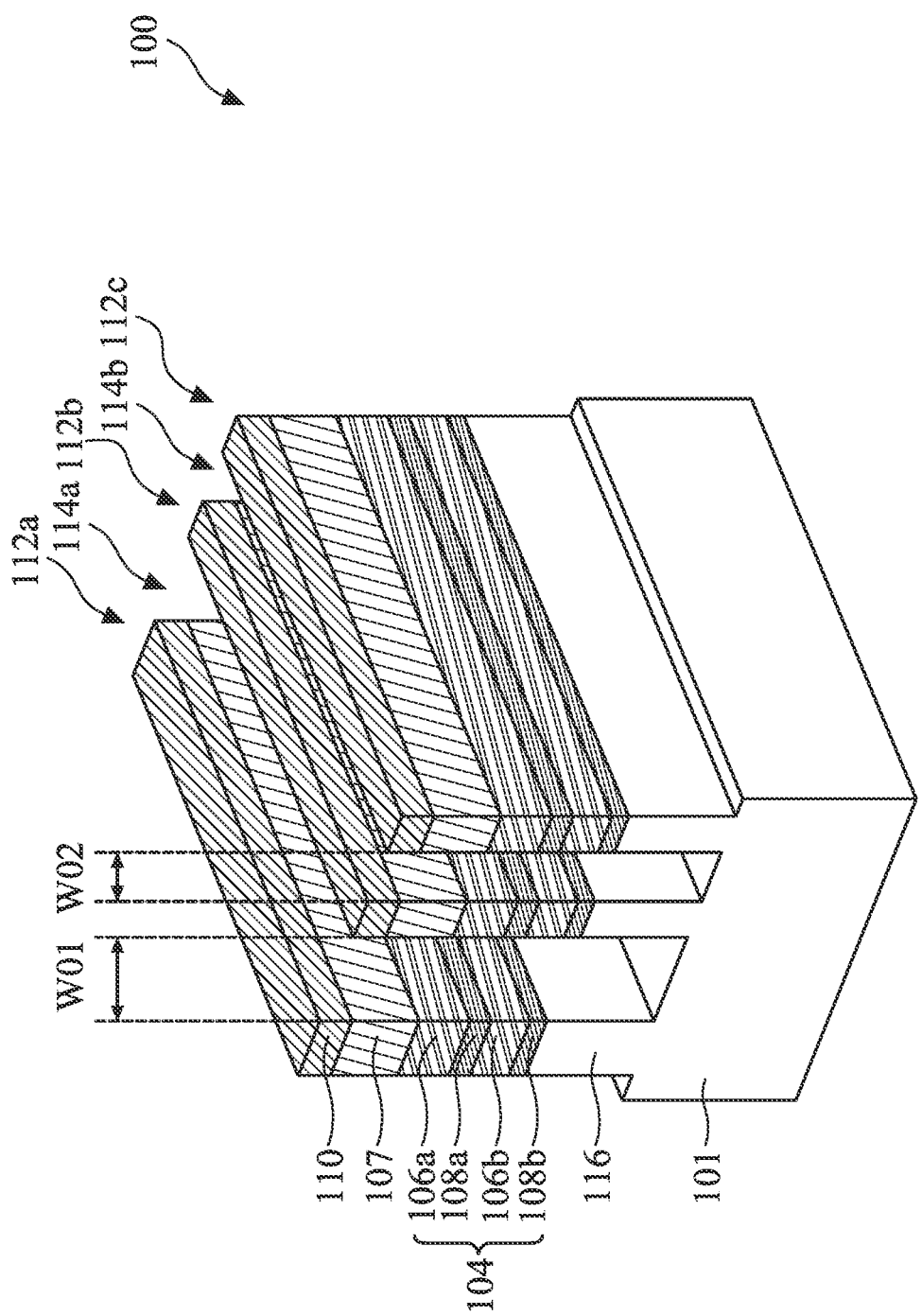

FIG. 2 is a perspective view of one of the various stages of manufacturing the semiconductor device structure 100, in accordance with some embodiments. As shown in FIG. 2, fin structures 112 (112a-112c) are formed from the stack of semiconductor layers 104. Each fin structure 112 has an upper portion including the semiconductor layers 106, 108 and a well portion 116 formed from the substrate 101. The fin structures 112 may be fabricated using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 (e.g., 114a, 114b) in unprotected regions through the mask structure 110, through the stack of semiconductor layers 104, and into the substrate 101, thereby leaving the plurality of extending fin structures 112 (e.g., 112a, 112b, 112c). The trenches 114 extend along the X direction. The trenches 114 may be etched using a dry etch (e.g., RIE), a wet etch, and/or combination thereof.

As shown in FIG. 2, the trenches 114a and 114b are formed with different widths between the fin structures 112a, 112b, 112c. The trench 114a is formed between the fin structure 112a and the fin structure 112b and has a width W01. The trench 114b is formed between the fin structure 112b and the fin structure 112c and has a width W02. The width W02 may be equal, less, or greater than the width W01 of the trench 114a. In the embodiment shown in FIG. 2, the width W01 is greater than the width W02. The width of the trenches 114a, 114b may vary upon the width of the fin structures 112a, 112b, 112c, which varies depending on the channel width of the devices needed in the semiconductor device structure 100. As described above, the first semiconductor layers 106 may serve as channels in a nanosheet and/or forksheet transistor device. The devices with a wider channel, such as the device fabricated from the fin structures 112a, 112b, may be more suitable for high-speed applications, such as a NAND device. The devices with a narrower channel, such as the device fabricated from the fin structures 112b, 112c, may be more suitable for low-power and low-leakage applications, such as an inverter device. Therefore, trenches with wider width (e.g., trench 114a) may be formed in regions where devices/transistors require higher voltage current and/or higher performance, while trenches with narrower width (e.g., trench 114b) may be formed in regions where greater density of devices/transistors is desired.

Figure 3:
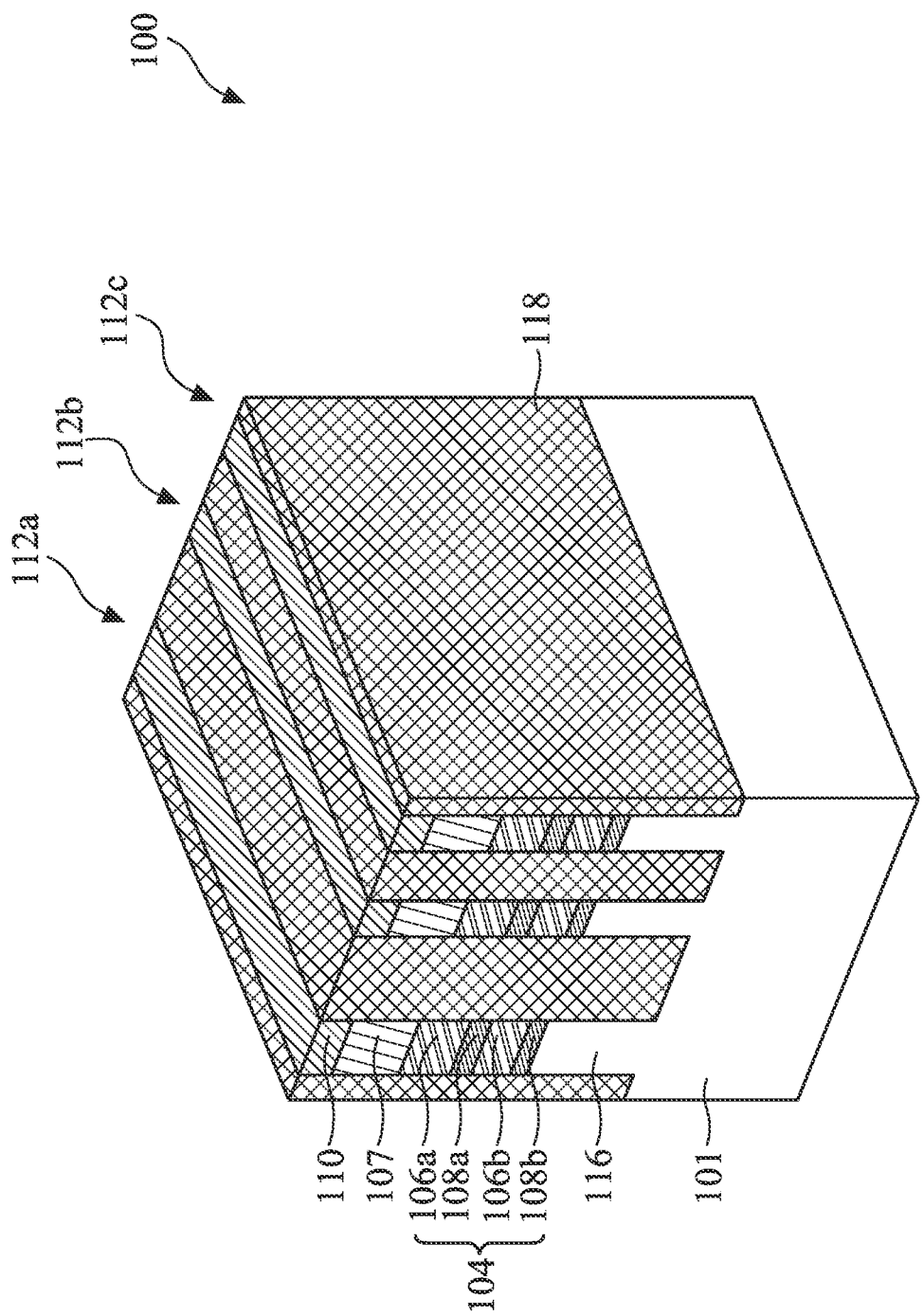

FIG. 3 is a perspective view of one of the various stages of manufacturing the semiconductor device structure 100, in accordance with some embodiments. As shown in FIG. 3, after the fin structures 112 are formed, an insulating material 118 is formed on the substrate 101. The insulating material 118 fills the trenches 114 (FIG. 2) between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
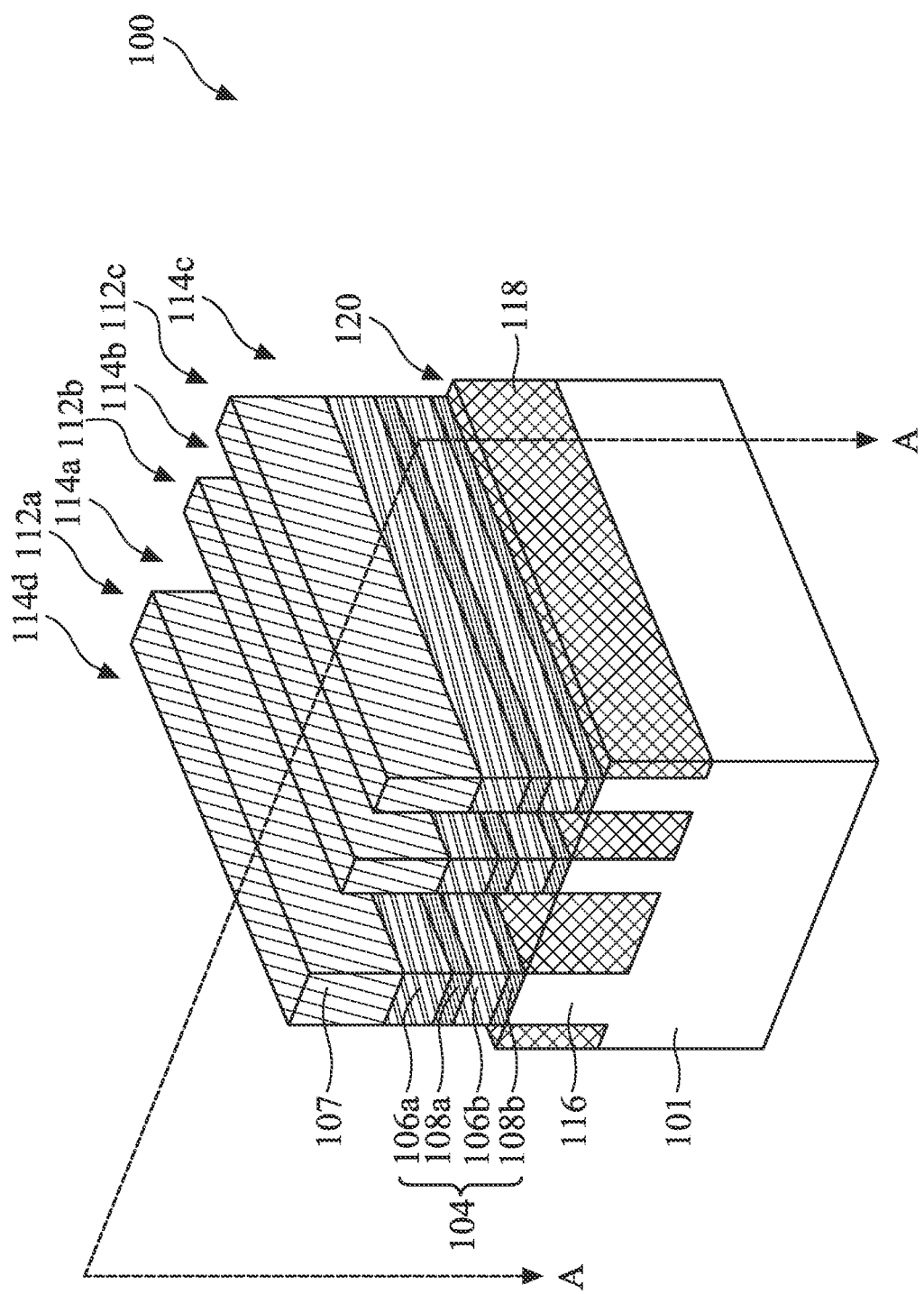

FIG. 4 is a perspective view of one of the various stages of manufacturing the semiconductor device structure 100, in accordance with some embodiments. As shown in FIG. 4, the insulating material 118 is recessed to form an isolation region 120. The recess of the insulating material 118 exposes portions of the fin structures 112, such as the stack of semiconductor layers 104. The recess of the insulating material 118 reveals the trenches 114 between the neighboring fin structures 112. The isolation region 120 may be formed using a suitable process, such as a dry etching process, a wet etching process, or a combination thereof. A top surface of the insulating material 118 may be level with or slightly below a surface of the second semiconductor layer 108*b* in contact with the well portion 116 formed from the substrate 101. Thereafter, the mask structures 110 is removed by any suitable process, such as a CMP process.

Figure 5:
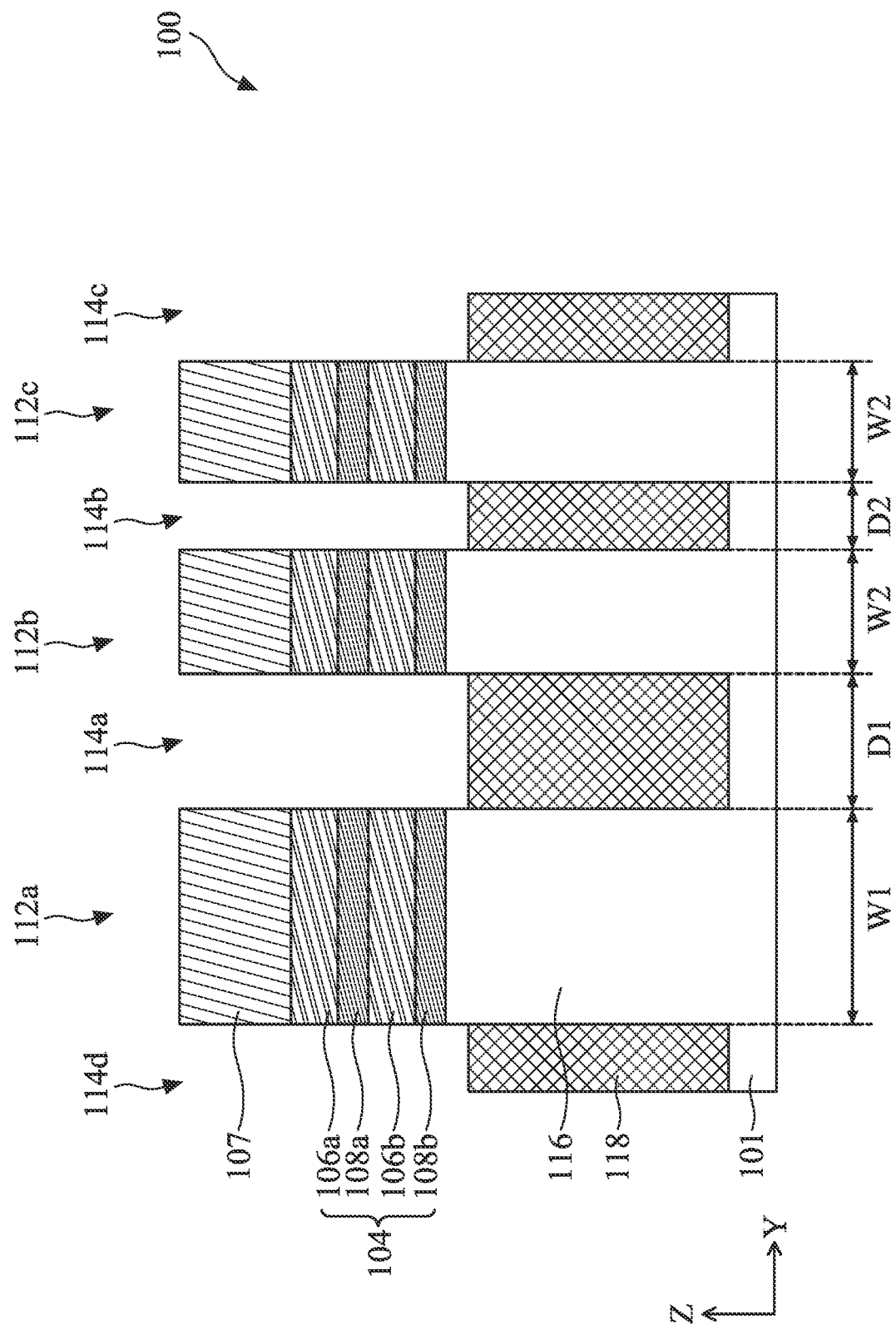
FIGS. 5-11 are cross-sectional side views of various stages of manufacturing the semiconductor device structure taken along line A-A of FIG. 4, in accordance with some embodiments.

FIGS. 5-11 are cross-sectional side views of various stages of manufacturing the semiconductor device structure taken along line A-A of FIG. 4, in accordance with some embodiments. As shown in FIG. 5, the semiconductor device structure 100 has three fin structures 112*a*, 112*b*, and 112*c* formed along the Y direction. The fin structure 112*a* may have a first width W1, and the fin structures 112*b*, 112*c* may each has a second width W2. In the embodiment shown in FIG. 5, the first width W1 is greater than the second width W2. The widths W1 and W2 may correspond to the device's channel width.

As discussed above, the distances between adjacent fins 112*a*, 112*b*, and 112*c* may vary depending on the devices to be formed in the area. In some embodiments, adjacent fin structures used to form similar devices may be spaced apart by a first distance D1, and adjacent fin structures used to form different devices may be spaced apart by a second distance D2. The distance D1 or D2 between adjacent fin structures may be defined by the distance between a first sidewall of one fin structure and a second sidewall of the adjacent fin structure facing the first sidewall. In the embodiment shown in FIG. 5, the first distance D1 is greater than the second distance D2. With the smaller distance D2 (i.e., reduced fin-to-fin spacing) between the fin structures 112*b* and 112*c*, layers of a first dielectric feature 130 (FIG. 7) subsequently formed in the trench 114*b* may merge (FIG. 6), while the trench 114*a* between the fin structures 112*a* and 112*b* remains open after the deposition of layers of the first dielectric feature 130 due to the wider distance D1. The merged layers of the first dielectric feature 130 allow the nanosheet channels to attach to both sides of the first dielectric feature 130 and form forksheet transistors at a later stage. The reduced fin-to-fin spacing and fork-like gate nanosheet transistors enable greater device density (even with greater channel width) and superior area and performance scalability.

Depending on the application, the trenches 114*c* and 114*d* may have a width corresponding to the first distance D1 or the second distance D2. In some embodiments, a fin structure (not shown) having a width corresponding to W1 may be disposed adjacent to and spaced apart the fin structure 112*a* by the trench 114*d*. Likewise, a fin structure (not shown) having a width corresponding to W2 may be disposed adjacent to and spaced apart the fin structure 112*c* by the trench 114*c*.

Figure 6:
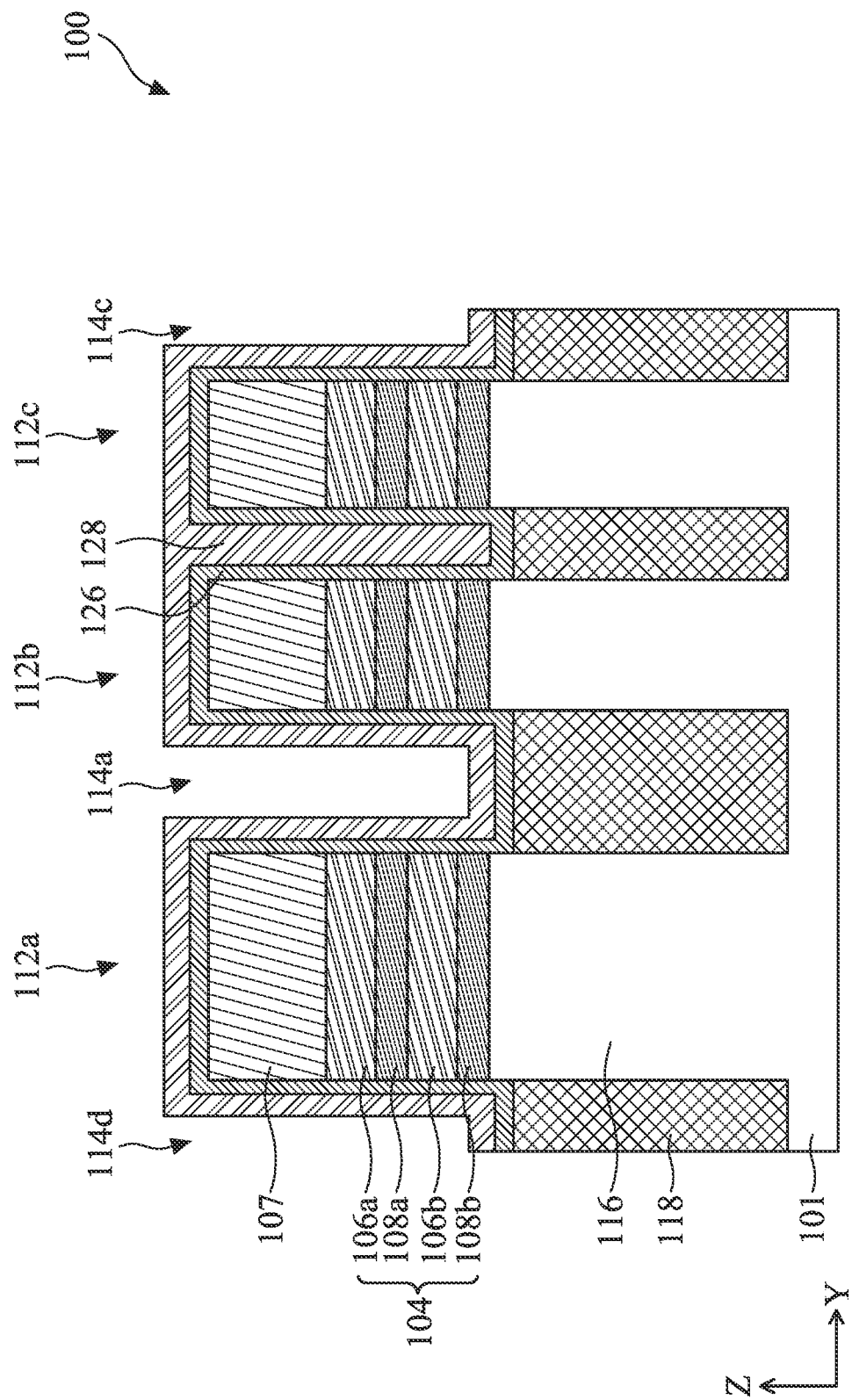

In FIG. 6, a first dielectric layer 126 is formed on the exposed surfaces of the semiconductor device structure 100 and in the trenches 114*a*, 114*b* (FIG. 5), 114*c*, 114*d*. The first dielectric layer 126 may include a high-K material having a K value of 7 or above. Exemplary materials may include, but are not limited to $HfO_2$, $ZrO_2$, $HfAlO_x$, $HfSiO_x$, $Al_2O_3$, etc. The first dielectric layer 126 may be formed by a conformal process, such as an ALD process. The first dielectric layer 126 may be formed on the exposed surface of the insulating material 118 at the bottom of the trenches 114*a*, 114*b*, 114*c*, 114*d* and on the exposed portions of the fin structures 112*a*, 112*b*, 112*c* (e.g., first and second semiconductor layers 106, 108 and the sacrificial layer 107). The first dielectric layer 126 may have substantially the same thickness ranging from about 0.5 nm to about 10 nm.

Next, a second dielectric layer 128 is formed on the first dielectric layer 126 in the trench 114*a*, 114*b* (FIG. 5), 114*c*, 114*d*, and over the fin structures 112*a*, 112*b*, 112*c*. The second dielectric layer 128 fills the trench 114*b* due to the small distance D2 but not the trench 114*a*. The second dielectric layer 128 may include a low-K dielectric material (e.g., a material having a K value lower than 7). In some embodiments, the second dielectric layer 128 is a silicon-containing low-K dielectric material such as $SiO_2$, SiN, SiCN, SiOC, or SiOCN. The second dielectric layer 128 may be formed by a conformal process, such as an ALD process. The second dielectric layer 128 may have a thickness ranging from about 5 nm to about 30 nm. If the thickness of the second dielectric layer 128 is less than about 5 nm, the trench 114*b* may not be filled. On the other hand, if the thickness of the second dielectric layer 128 is greater than about 30 nm, the manufacturing cost is increased without significant advantage.

Figure 7:
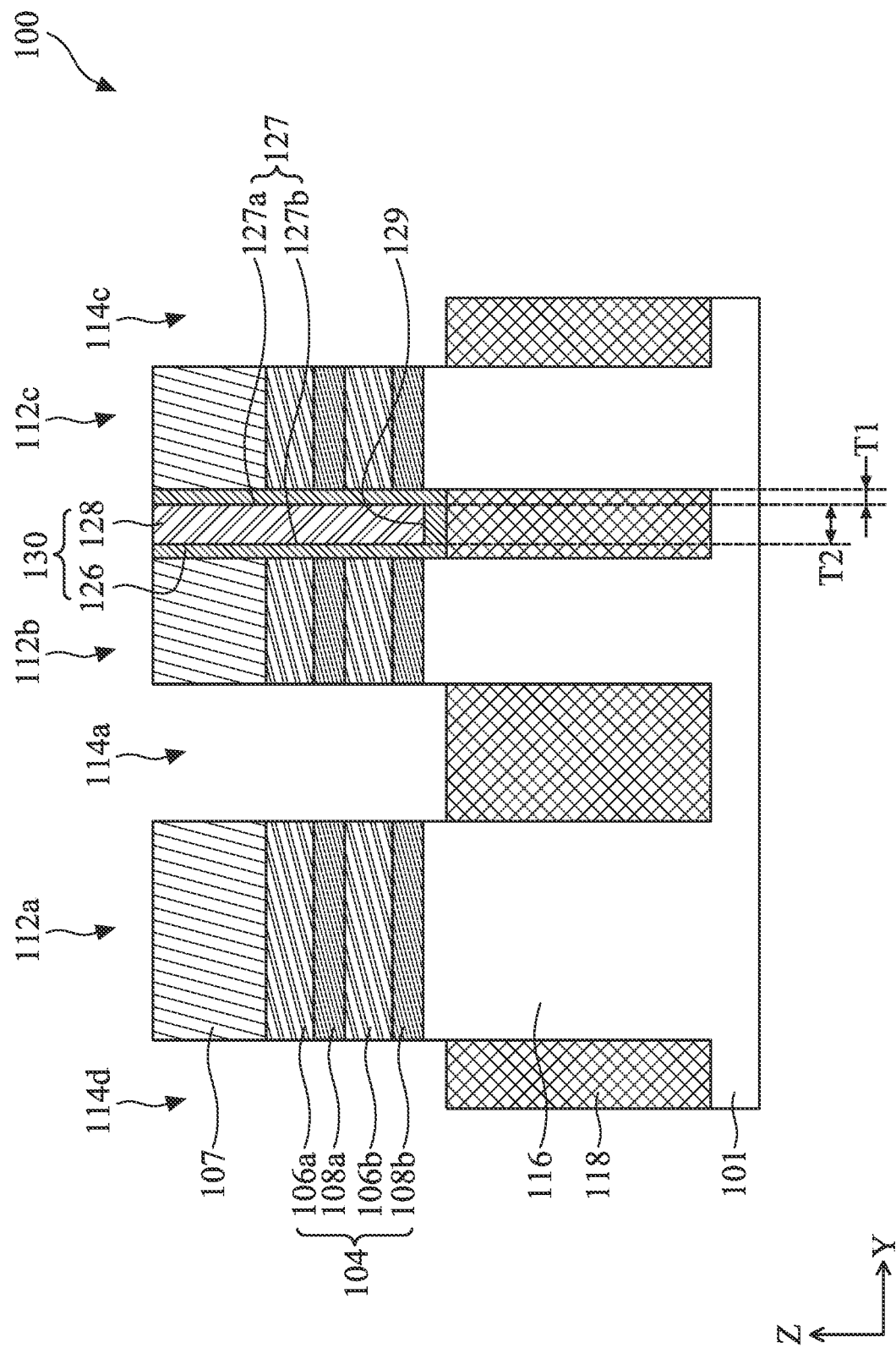

Next, as shown in FIG. 7, the first dielectric layer 126 and the second dielectric layer 128 are recessed. The recess of the first dielectric layer 126 and the second dielectric layer 128 may be performed by any suitable removal process, such as dry etch, wet, etch, or a combination thereof. The removal process may be selective etch processes that remove the first dielectric layer 126 and the second dielectric layer 128 but not the sacrificial layers 107, the first semiconductor layers 106, the second semiconductor layers 108, and the insulating material 118. Because the trench 114*a* is not completely filled and has a larger dimension (i.e., first distance D1) in the Y direction compared to that of the trench 114*b* (FIG. 5), the etchant removes more of the first dielectric layer 126 and the second dielectric layer 128 in the trench 114*a* (FIG. 6) than the first dielectric layer 126 and the second dielectric layer 128 in the trench 114*b* (FIG. 5). As a result, the first dielectric layer 126 and the second dielectric layer 128 in the trench 114*a* are etched at a faster rate than the etch rate of the first dielectric layer 126 and the second dielectric layer 128 in the trench 114*b*. In cases where the first dielectric layer 126 and the second dielectric layer 128 include different materials, and a first etch process may be performed to recess the second dielectric layer 128 followed by a second etch process to recess the first dielectric layer 126.

The removal process is performed until the first dielectric layer 126 and the second dielectric layer 128 in the trenches 114*a*, 114*c*, 114*d* are completely etched away. The removal process also removes the first dielectric layer 126 and the second dielectric layer 128 on exposed surfaces of the fin structure 112*a*, 112*b*, 112*c* and the insulating material 118. As a result of the removal process, the first dielectric layer 126 and the second dielectric layer 128 on exposed surfaces of the semiconductor device structure 100 are removed except for the first dielectric layer 126 and the second dielectric layer 128 filled in the trench 114*b* (FIG. 5). The first dielectric layer 126 and the second dielectric layer 128 in the trench 114*b* may be referred to herein as a first dielectric feature 130. The sidewalls 127 (127*a*, 127*b*) and the bottom 129 of the second dielectric layer 128 are in contact with the first dielectric layer 126. The sidewall 127*a* opposes the sidewall 127*b*, and the bottom 129 connects the sidewall 127*a* to sidewall 127*b*. The first dielectric layer 126 is formed with a first thickness T1 corresponding to the thickness of the first dielectric layer 126 discussed above, and the second dielectric layer 128 is formed with a second thickness T2 greater than the first thickness T1.

Figure 8:
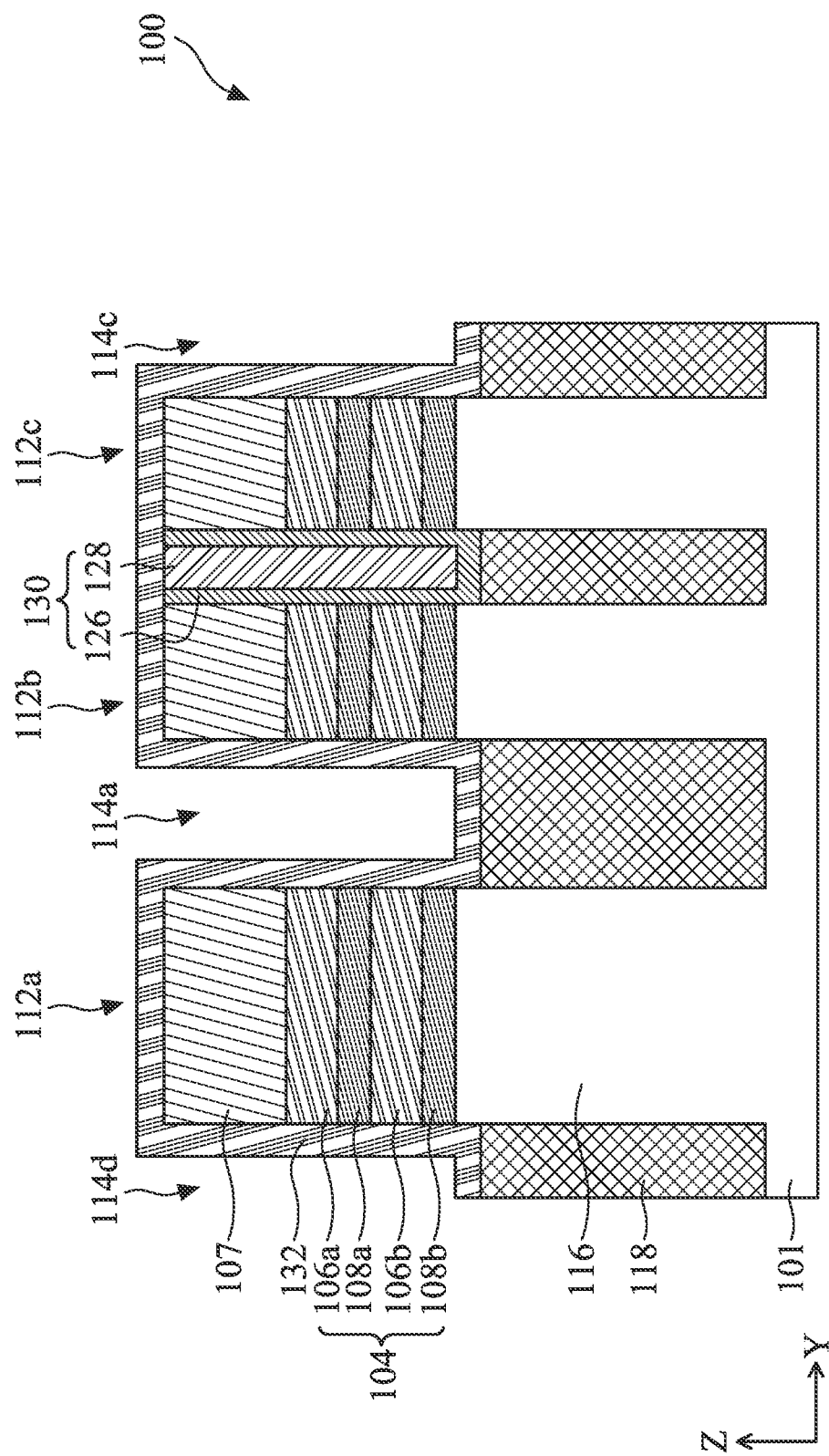
Figure 9:
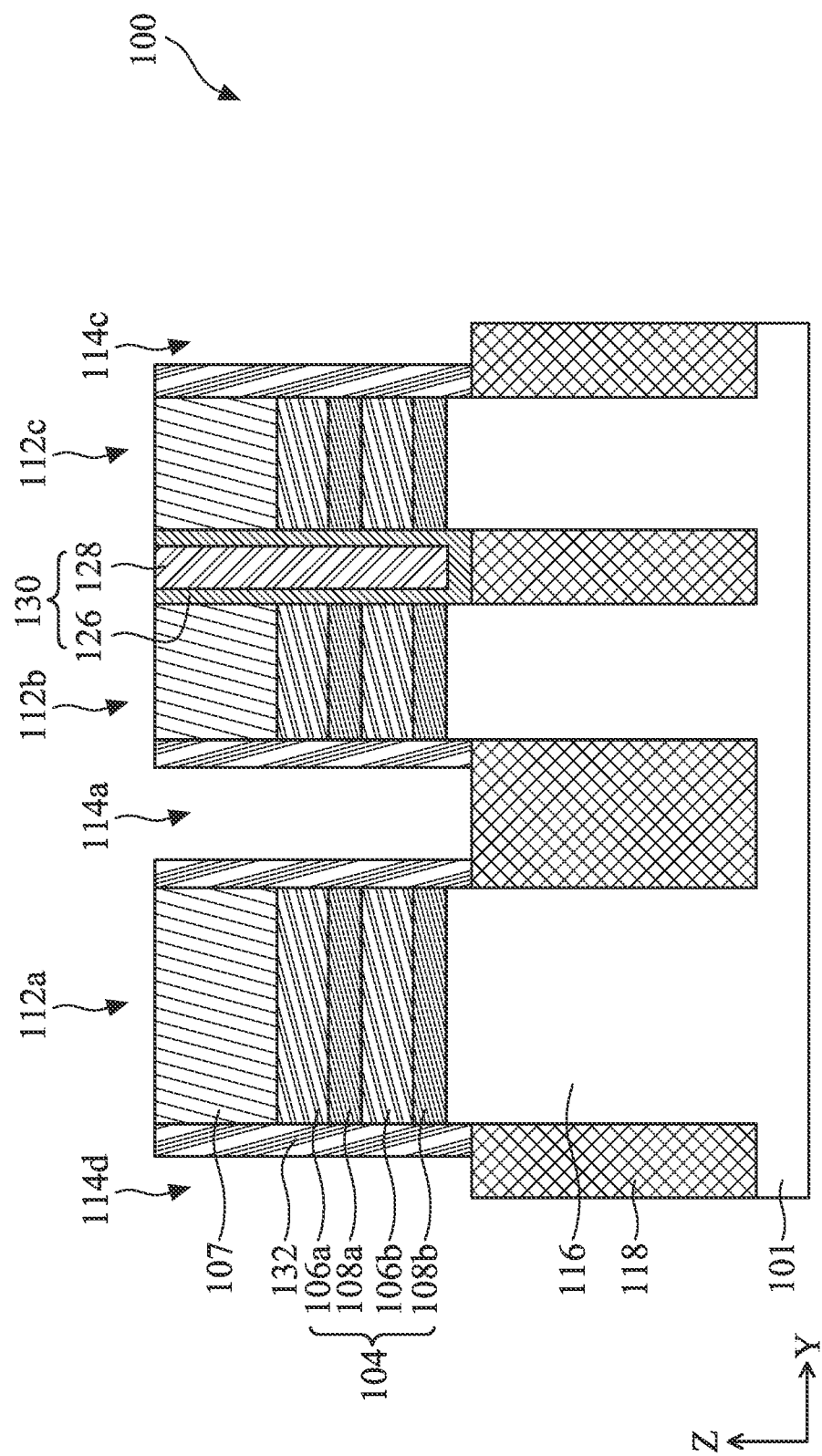

Next, as shown in FIG. 8, a cladding layer 132 is formed on the exposed surfaces of the stack of semiconductor layers 104, the dielectric feature 130 (e.g., a top surface of the first dielectric layer 126 and a top surface of the second dielectric layer 128), and the insulating material 118. The cladding layer 132 may be formed by a conformal process, such as an ALD process. The cladding layer 132 may have substantially the same thickness ranging from about 1 nm to about 10 nm. The thickness of the cladding layer 132 formed on the sidewalls of the fin structures 112a, 112b, 112c may define the space for a second dielectric feature 134 (FIG. 10) and a gate electrode layer 182 (FIG. 21A) to be formed therein after subsequent removal of the cladding layers 132. Thus, if the thickness of the cladding layer 132 is more than about 10 nm, the trench 114a may be filled, resulting in the second dielectric feature 134 and the gate electrode layer from not forming in the trench 114a (FIG. 9). In some embodiments, the cladding layer 132 includes a semiconductor material. In some embodiments, the cladding layer 132 and the second semiconductor layers 108 are made of the same material having the same etch selectivity. For example, the cladding layer 132 and the second semiconductor layers 108 include SiGe. The cladding layer 132 and the second semiconductor layer 108 may be removed subsequently to create space for the gate electrode layer.

Next, as shown in FIG. 9, portions of the cladding layer 132 are removed. The removal of the cladding layer 132 may be performed by any suitable removal process, such as dry etch, wet, etch, or a combination thereof. The removal process may be an anisotropic etch process to remove the cladding layer 132 formed on horizontal surfaces of the fin structures 112a, 112b, 112c (e.g., top surfaces of the sacrificial layer 107, the first dielectric layer 126 and the second dielectric layer 128) and on the insulating material 118. The removal process does not remove the cladding layer 132 formed on vertical surfaces of the fin structures 112a, 112b, 112c.

Figure 10:
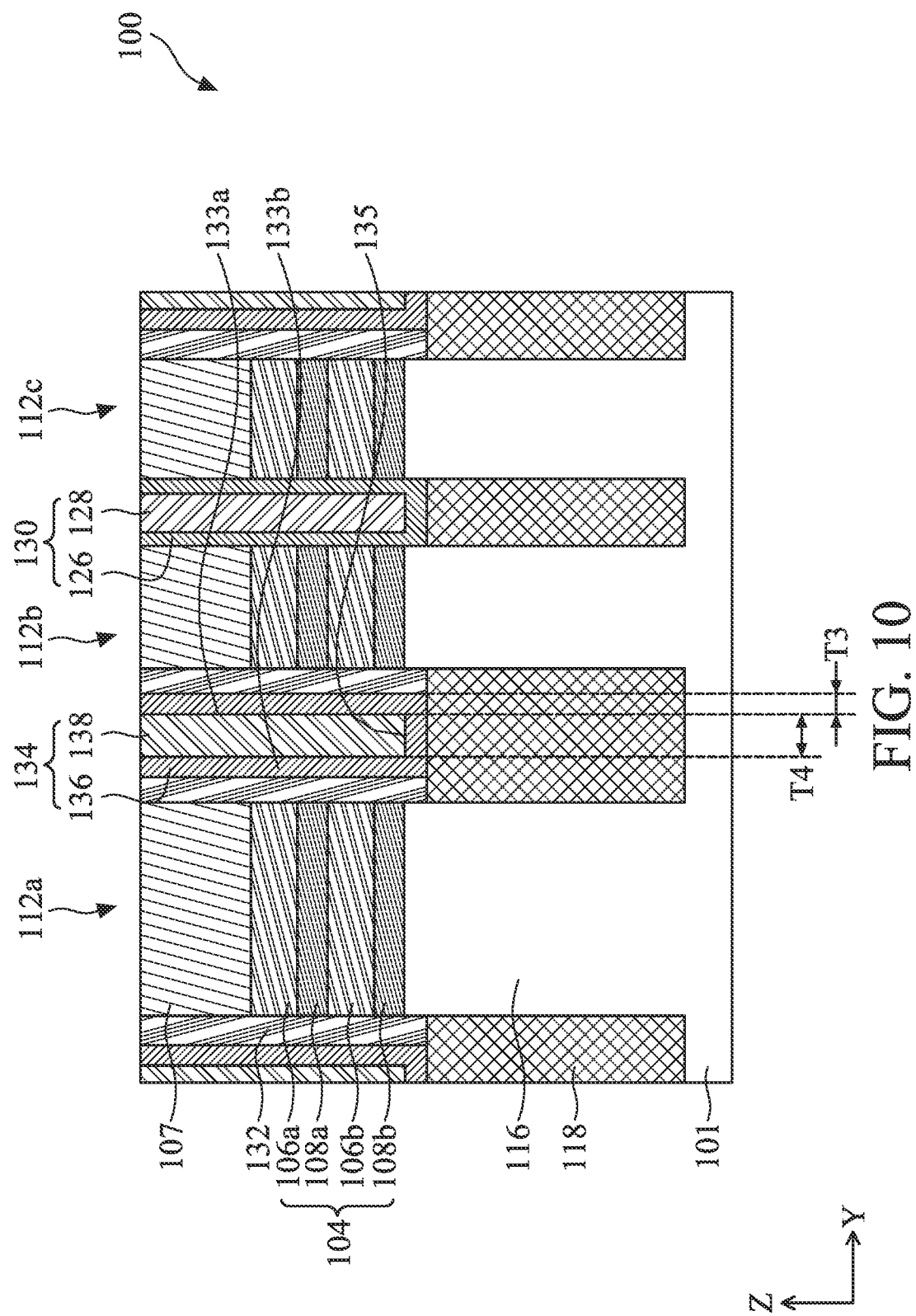

Next, as shown in FIG. 10, a second dielectric feature 134 is formed in the trenches 114a, 114c, 114d (FIG. 9). The second dielectric feature 134 includes a third dielectric layer 136 and a fourth dielectric layer 138 formed on the third dielectric layer 136. The third dielectric layer 136 may include a high-K material having a K value of 7 or above. In some embodiments, the third dielectric layer 136 includes the same material as the first dielectric layer 126. The fourth dielectric layer 138 may include a low-K dielectric material (e.g., a material having a K value lower than 7). In some embodiments, the fourth dielectric layer 138 is a silicon-containing low-K dielectric material such as SiCN, SiOC, or SiOCN. In some embodiments, the fourth dielectric layer 138 includes the same material as the second dielectric layer 128. The second dielectric feature 134 may be formed in a similar fashion as the first dielectric feature 130. For example, the third dielectric layer 136 may be formed on the cladding layer 132 and on the exposed surface of the insulating material 118 at the bottom of the trenches 114a, 114c, 114d and on the exposed portions of the first dielectric feature (e.g., top surfaces of the first and second dielectric layers 126, 128), using a conformal process, such as an ALD process. The third dielectric layer 136 may have substantially the same thickness ranging from about 1 nm to about 30 nm.

The fourth dielectric layer 138 is then formed in the trenches 114a, 114c, 114d and over the fin structures 112a, 112b, 112c and the first dielectric feature 130. The fourth dielectric layer 138 may be formed by a flowable process, such as an FCVD process. The fourth dielectric layer 138 may have a thickness ranging from about 2 nm to about 15 nm. The fourth dielectric material 138 fills the trenches 114a, 114c, 114d. Thus, if the thickness of the fourth dielectric layer 138 is less than about 2 nm, the trenches 114a, 114c, 114d may not be filled.

Next, a planarization process is performed so that the top surfaces of the third dielectric layer 136, the cladding layer 132, the sacrificial layer 107, the fourth dielectric layer 138, the first dielectric layer 126, and the second dielectric layer 128 are co-planar, as shown in FIG. 10. The planarization process may be any suitable process, such as a CMP process. As the result of the planarization process, the second dielectric feature 134 is formed in the trenches 114a, 114c, 114d (FIG. 9). The sidewalls 133 (133a, 133b) and the bottom 135 of the fourth dielectric layer 138 are in contact with the third dielectric layer 136. The sidewall 133a opposes the sidewall 133b, and the bottom 135 connects the sidewall 133a to sidewall 133b. The third dielectric layer 136 is formed with a third thickness T3 corresponding to the thickness of the third dielectric layer 136 discussed above, and the fourth dielectric layer 138 is formed with a fourth thickness T4 greater than the third thickness T3. The third thickness T3 of the third dielectric layer 136 may be greater, equal, or less than the first thickness T1 of the first dielectric layer 126. In some embodiments, the third thickness T3 is substantially identical to the first thickness T1, which is about 1 nm to about 10 nm. In some embodiments, the third thickness T3 is less than the first thickness T1. In some embodiments, the third thickness T3 is greater than the first thickness T1. Likewise, the fourth thickness T4 of the fourth dielectric layer 138 may be greater, equal, or less than the second thickness T2 of the second dielectric layer 128. In one embodiment, the fourth thickness T4 is equal to the second thickness T2, which is about 5 nm to about 40 nm. In some embodiments, the fourth thickness T4 is less than to the second thickness T2. In some embodiments, the fourth thickness T4 is greater than to the second thickness T2.

Figure 11:
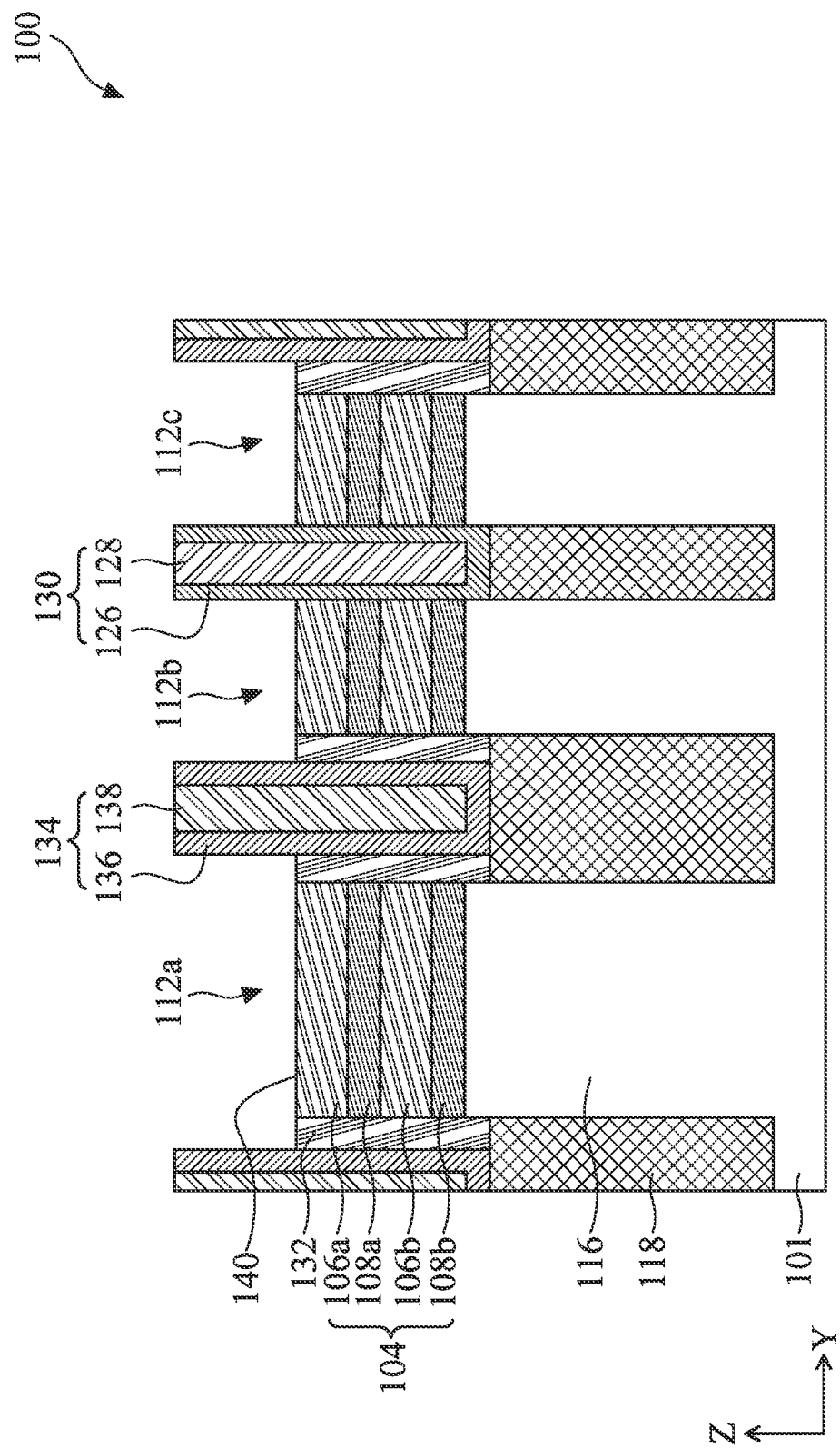

In FIG. 11, the cladding layers 132 are recessed, and the sacrificial layers 107 are removed. The recess of the cladding layers 132 may be performed by any suitable etch process, such as dry etch, wet etch, or a combination thereof. The etch process may be controlled so that the remaining cladding layers 132 are substantially at the same level as the top surface 140 of the topmost first semiconductor layer 106 in the stack of semiconductor layers 104. In cases where the cladding layers 132 and the sacrificial layers 107 are made of SiGe, the etch process may be a selective etch process that removes the cladding layers 132 and the sacrificial layers 107, but does not remove the layers of the first and second dielectric features 130, 134. The removal of the sacrificial layers 107 exposes the top surfaces of the fin structures 112a, 112b, 112c.

Figure 12B:
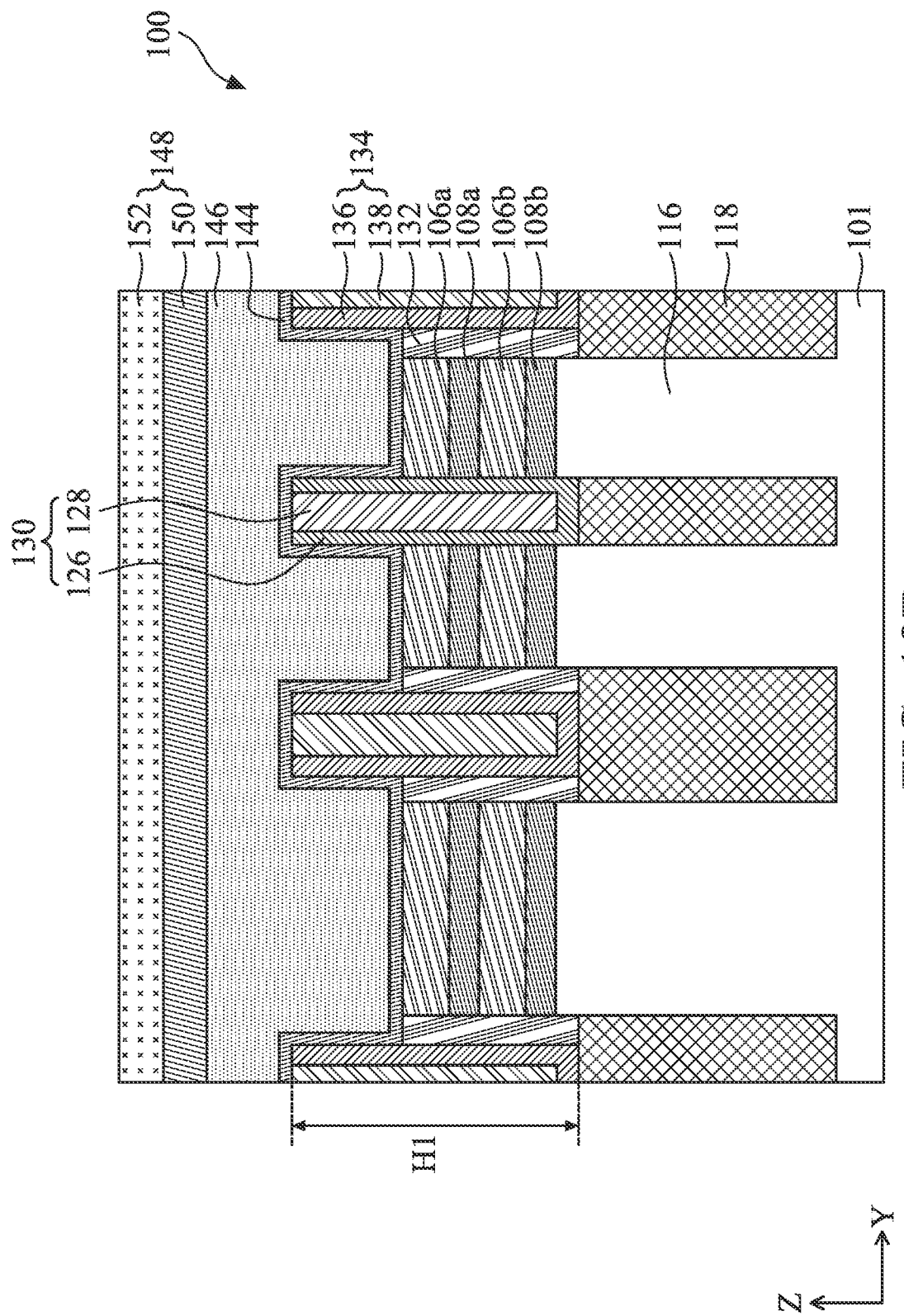
FIGS. 12B and 12C are cross-sectional side views of the semiconductor device structure taken along cross-section B-B and cross-section C-C of FIG. 12A, respectively, in accordance with some embodiments.
Figure 12C:
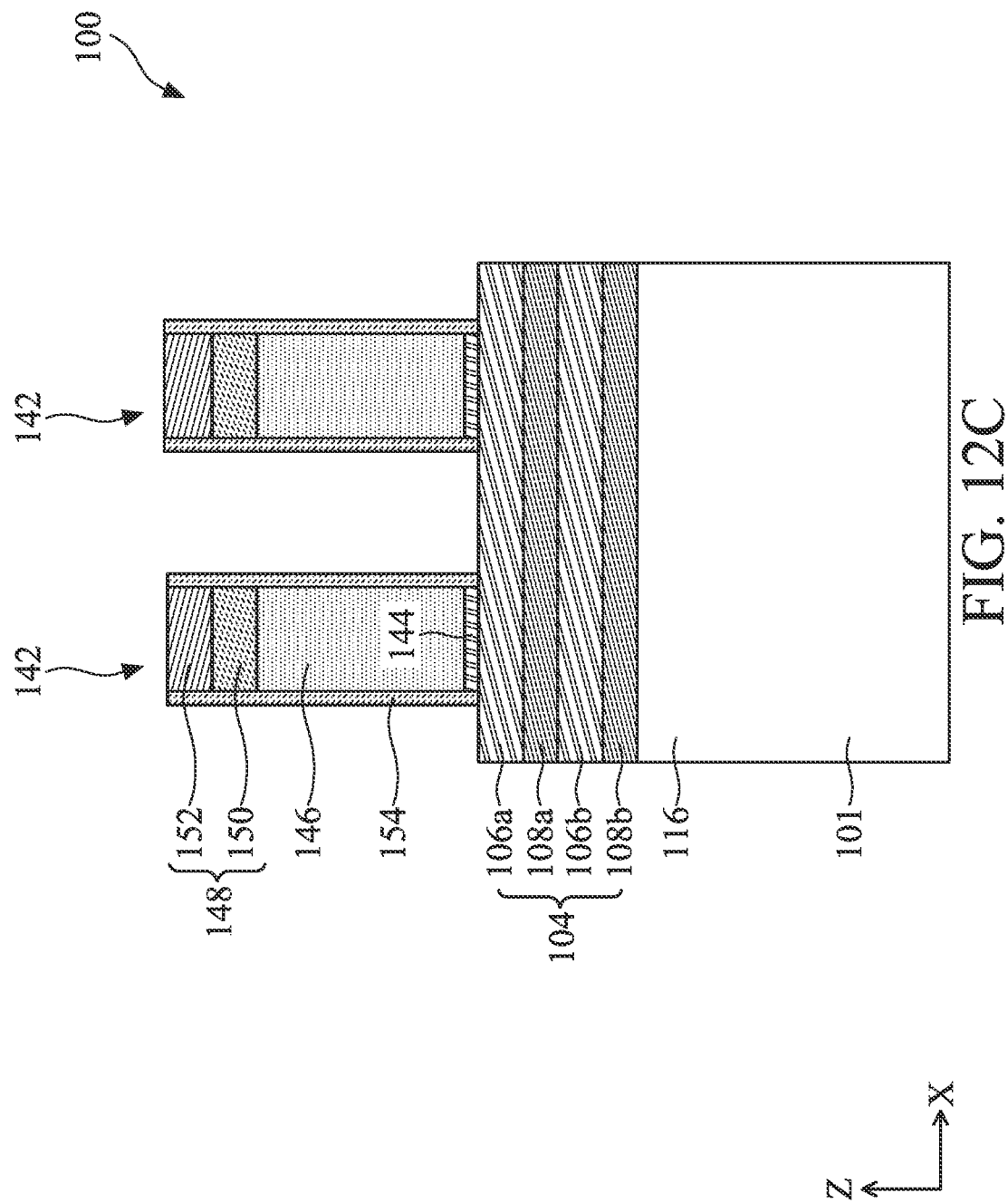

FIG. 12A is a perspective view of one of the various stages of manufacturing the semiconductor device structure 100, in accordance with some embodiments. FIGS. 12B and 12C are cross-sectional side views of the semiconductor device structure taken along cross-section B-B and cross-section C-C of FIG. 12A, respectively, in accordance with some embodiments. Cross-section C-C is in a plane of the fin structure 112c along the X direction. Cross-section B-B is in a plane perpendicular to cross-section C-C and is in sacrificial gate stacks 142 along the Y direction. As shown in FIG. 12A, one or more sacrificial gate stacks 142 are formed on the semiconductor device structure 100. The sacrificial gate stacks 142 may each include a sacrificial gate dielectric layer 144, a sacrificial gate electrode layer 146, and a mask structure 148. The sacrificial gate dielectric layer 144 may include one or more layers of dielectric material, such as $SiO_2$, SiN, a high-K dielectric material, and/or other suitable dielectric material. In some embodiments, the sacrificial gate dielectric layer 144 may be deposited by a CVD process, a sub-atmospheric CVD (SACVD) process, a FCVD process, an ALD process, a PVD process, or other suitable process. The sacrificial gate electrode layer 146 may include polycrystalline silicon (polysilicon). The mask structure 148 may include an oxygen-containing layer 150 and a nitrogen-containing layer 152. The sacrificial gate electrode layer 146 and the mask structure 148 may be formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 142 may be formed by first depositing blanket layers of the sacrificial gate dielectric layer 144, the sacrificial gate electrode layer 146, and the mask structure 148, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stack 142, the stacks of semiconductor layers 104 of the fins 112a, 112b, 112c are partially exposed on opposite sides of the sacrificial gate stack 142. While two sacrificial gate stacks 142 are shown, the number of the sacrificial gate stacks 142 is not limited to two. More than two sacrificial gate stacks 142 may be arranged along the X direction in some embodiments.

Next, a spacer 154 is formed on the sidewalls of the sacrificial gate stacks 142. The spacer 154 may be formed by first depositing a conformal layer that is subsequently etched back to form sidewall spacers 154. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fin structures 112a, 112b, 112c, the cladding layers 132, the third dielectric layers 136, and the fourth dielectric layers 138, leaving the spacers 154 on the vertical surfaces, such as the sidewalls of sacrificial gate stacks 142. The spacer 154 may be made of a dielectric material such as silicon oxide, silicon nitride, silicon carbide, silicon oxynitride, SiCN, silicon oxycarbide, SiOCN, and/or combinations thereof.

Figure 13A:
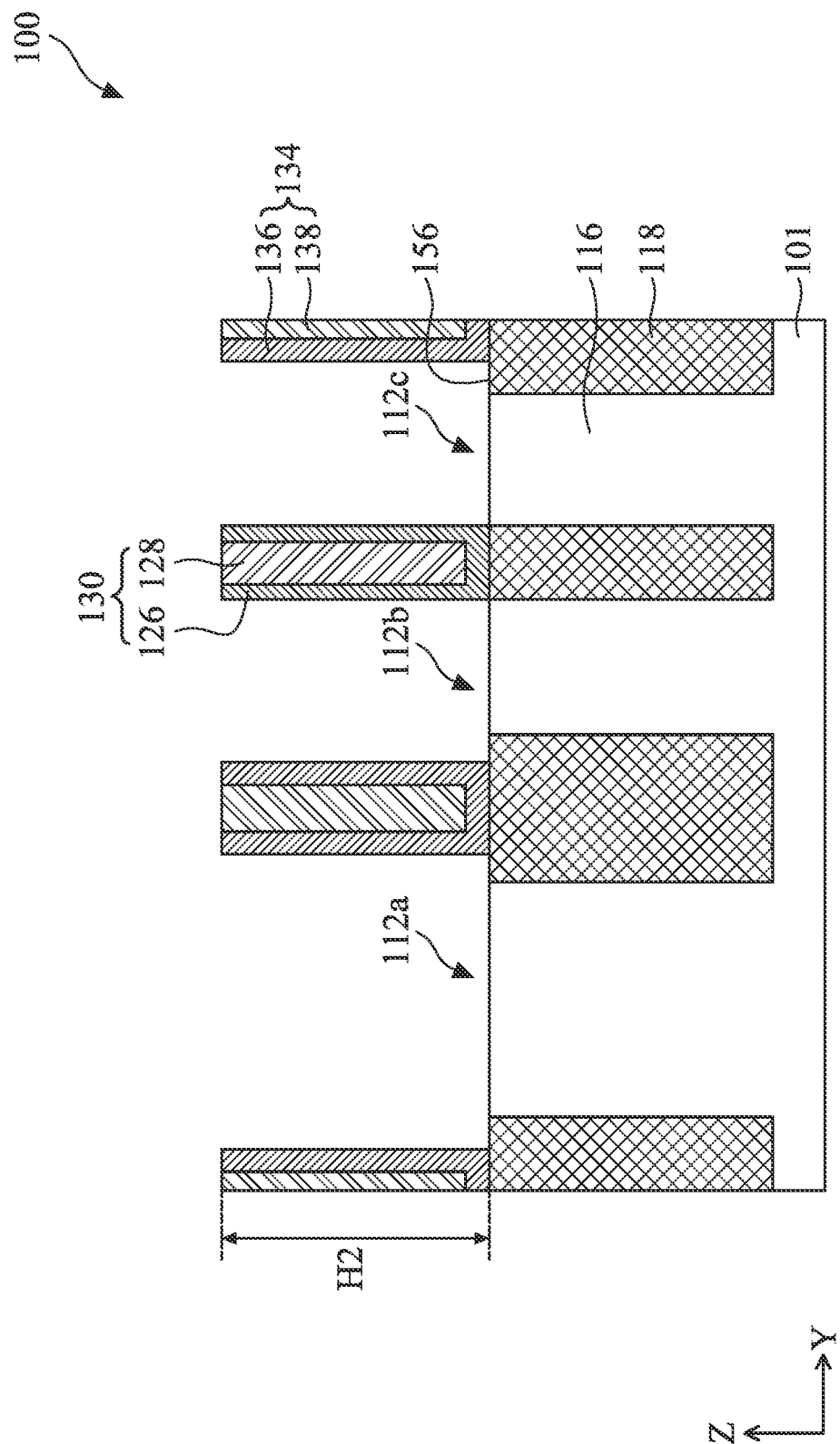
FIGS. 13A and 13B cross-sectional side views of one of the various stages of manufacturing the semiconductor device structure taken along cross-section A-A and cross-section C-C of FIG. 12A, respectively, in accordance with some embodiments.
Figure 13B:
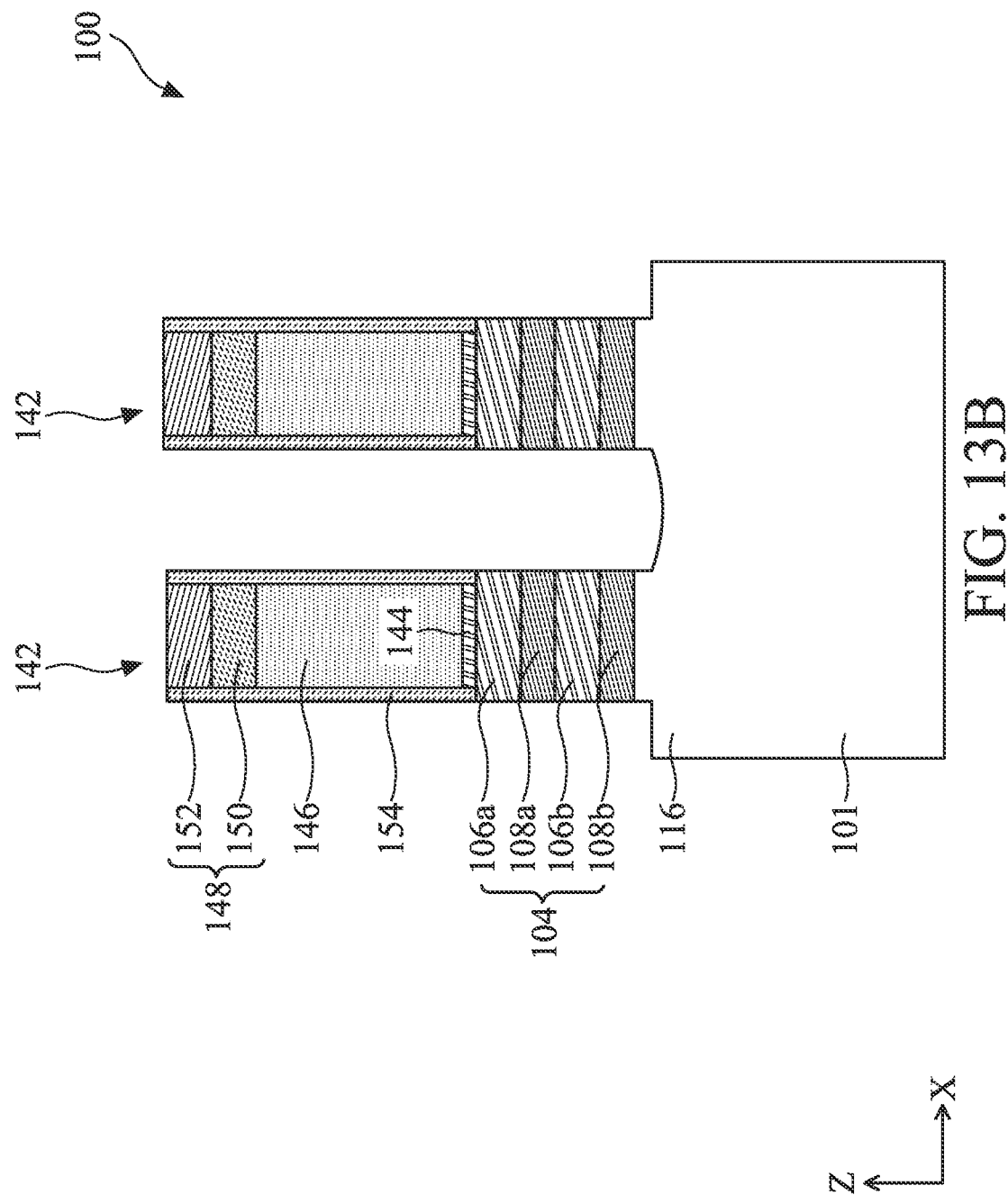

FIGS. 13A and 13B cross-sectional side views of the semiconductor device structure taken along cross-section A-A and cross-section C-C of FIG. 12A, respectively, in accordance with some embodiments. Cross-section A-A is in a plane perpendicular to cross-section C-C and across source/drain regions along the Y direction. In FIGS. 13A and 13B, exposed portions of the fin structures 112a, 112b, 112c (FIG. 12A), exposed portions of the cladding layers 132, exposed portions of the first and second dielectric layers 126, 128, and exposed portions of the third and fourth dielectric layers 136, 138 not covered by the sacrificial gate stacks 142 and the spacers 154 are selectively recessed by using one or more suitable etch processes, such as dry etch, wet etch, or a combination thereof. In some embodiments, exposed portions of the stacks of semiconductor layers 104 of the fin structures 112a, 112b, 112c are removed, exposing portions of the well portions 116 of the substrate 101. As shown in FIG. 13A, the exposed portions of the fin structures 112a, 112b, 112c are recessed to a level at or below the top surface 156 of the insulating material 118. The etch processes may include an etch process that recesses the exposed portions of the fin structures 112a, 112b, 112c and the exposed portions of the cladding layers 132.

In some embodiments, the etch process may reduce the height of the exposed portions of the first and second dielectric layers 126, 128 (i.e., dielectric feature 130) and exposed portions of the third and fourth dielectric layers 136, 138 (i.e., dielectric feature 134), as shown in FIG. 13A. Thus, the third dielectric layer 136 under the sacrificial gate stack 142 and the spacers 154 has the height H1, while the third dielectric layer 136 located between epitaxial S/D features 160 (FIG. 15A) has the height H2 less than the height H1. The height H1 may range from about 10 nm to 30 nm. Portions of the dielectric feature 134 having the height H1 is used to cut off the gate electrode layers, while portions of the dielectric feature 134 having the height H2 is in the S/D region to separate the source and the drain region. Thus, if the height H1 is less than about 10 nm, the gate electrode layers may not be sufficiently cut-off. On the other hand, if the height H2 is greater than about 30 nm, the manufacturing cost is increased without significant advantage. Likewise, the height of the first dielectric layer 126 between epitaxial S/D features 160 (FIG. 15A) will have a height less than the height of the first dielectric layer 126 under the sacrificial gate stack 142 and the spacers 154.

At this stage, end portions of the stacks of semiconductor layers 104 under the sacrificial gate stacks 142 and the spacers 154 have substantially flat surfaces which may be flush with corresponding spacers 154, as shown in FIG. 13B. In some embodiments, the end portions of the stacks of semiconductor layers 104 under the sacrificial gate stacks 142 and spacers 154 are slightly horizontally etched.

Figure 14A:
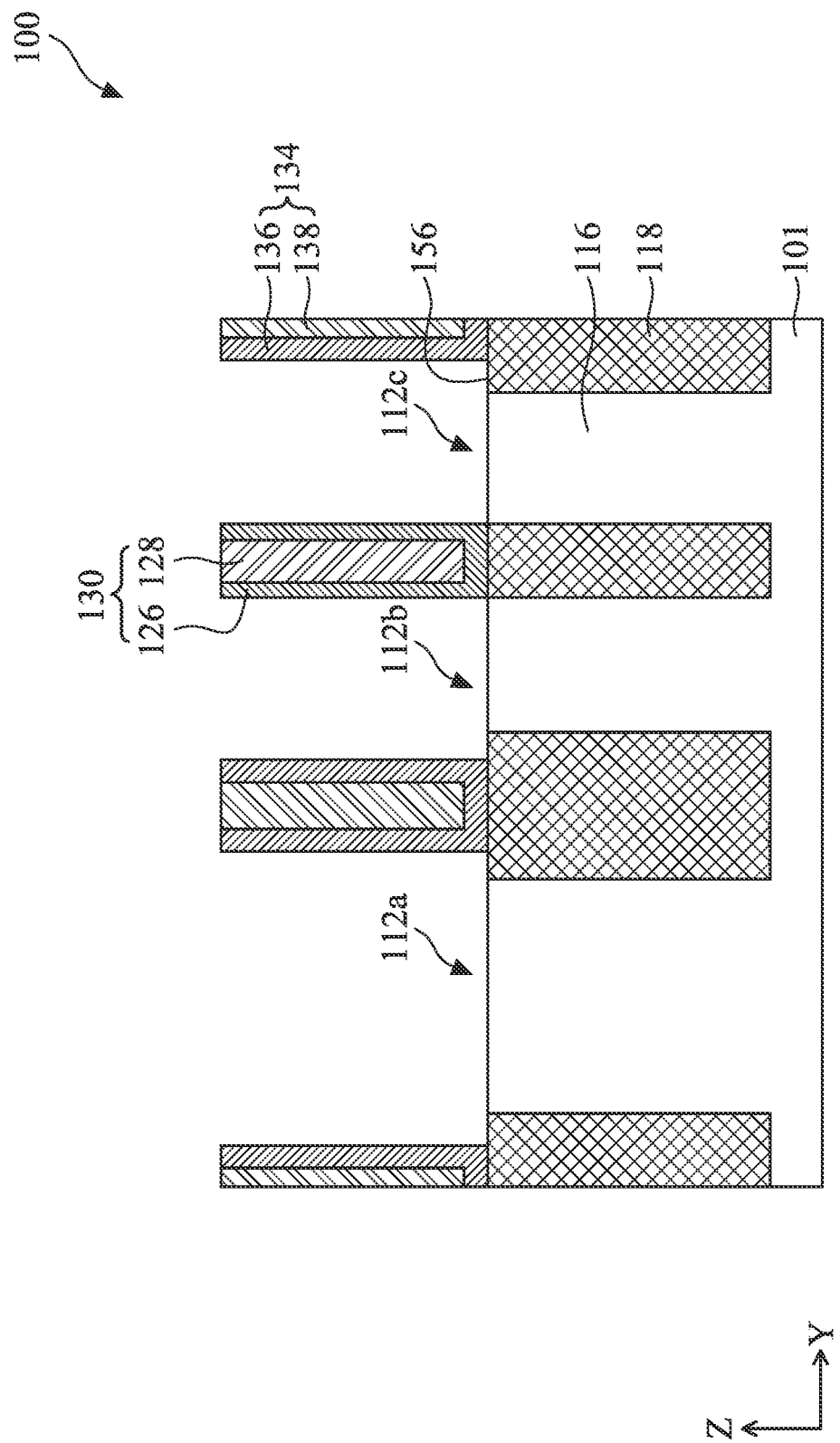
FIGS. 14A and 14B cross-sectional side views of one of the various stages of manufacturing the semiconductor device structure taken along cross-section A-A and cross-section C-C of FIG. 12A, respectively, in accordance with some embodiments.
Figure 14B:
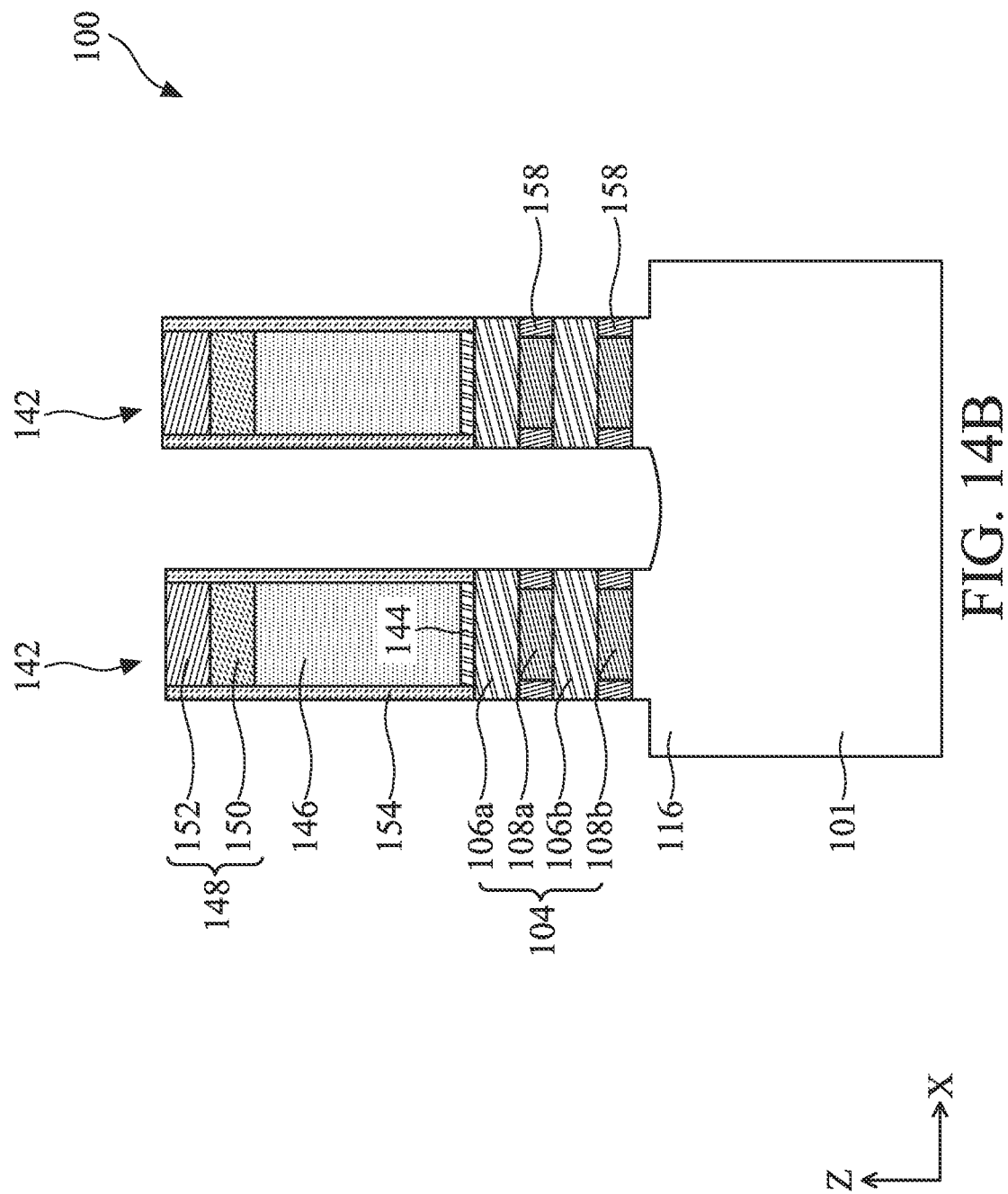

FIGS. 14A and 14B cross-sectional side views of the semiconductor device structure taken along cross-section A-A and cross-section C-C of FIG. 12A, respectively, in accordance with some embodiments. In FIG. 14B, the edge portions of each second semiconductor layer 108 and the edge portions of the cladding layers (not shown) are removed to form a gap. In some embodiments, the portions of the semiconductor layers 108 are removed by a selective wet etching process that does not remove the first semiconductor layers 106. For example, in cases where the second semiconductor layers 108 are made of SiGe, and the first semiconductor layers 106 are made of silicon, a selective wet etching including an ammonia and hydrogen peroxide mixtures (APM) may be used.

Next, dielectric spacers 158 are formed in the gaps formed as the result of removal of the second semiconductor layer 108 and the cladding layers, as shown in FIG. 14B. In some embodiments, the dielectric spacers 158 may be made of a low-K dielectric material, such as SiON, SiCN, SiOC, SiOCN, or SiN. In some embodiments, the dielectric spacers 158 may be formed by first forming a conformal dielectric layer using a conformal deposition process, such as ALD, followed by an anisotropic etching to remove portions of the conformal dielectric layer other than the dielectric spacers 158. The dielectric spacers 158 may be protected by the first semiconductor layers 106 during the anisotropic etching process.

Figure 15A:
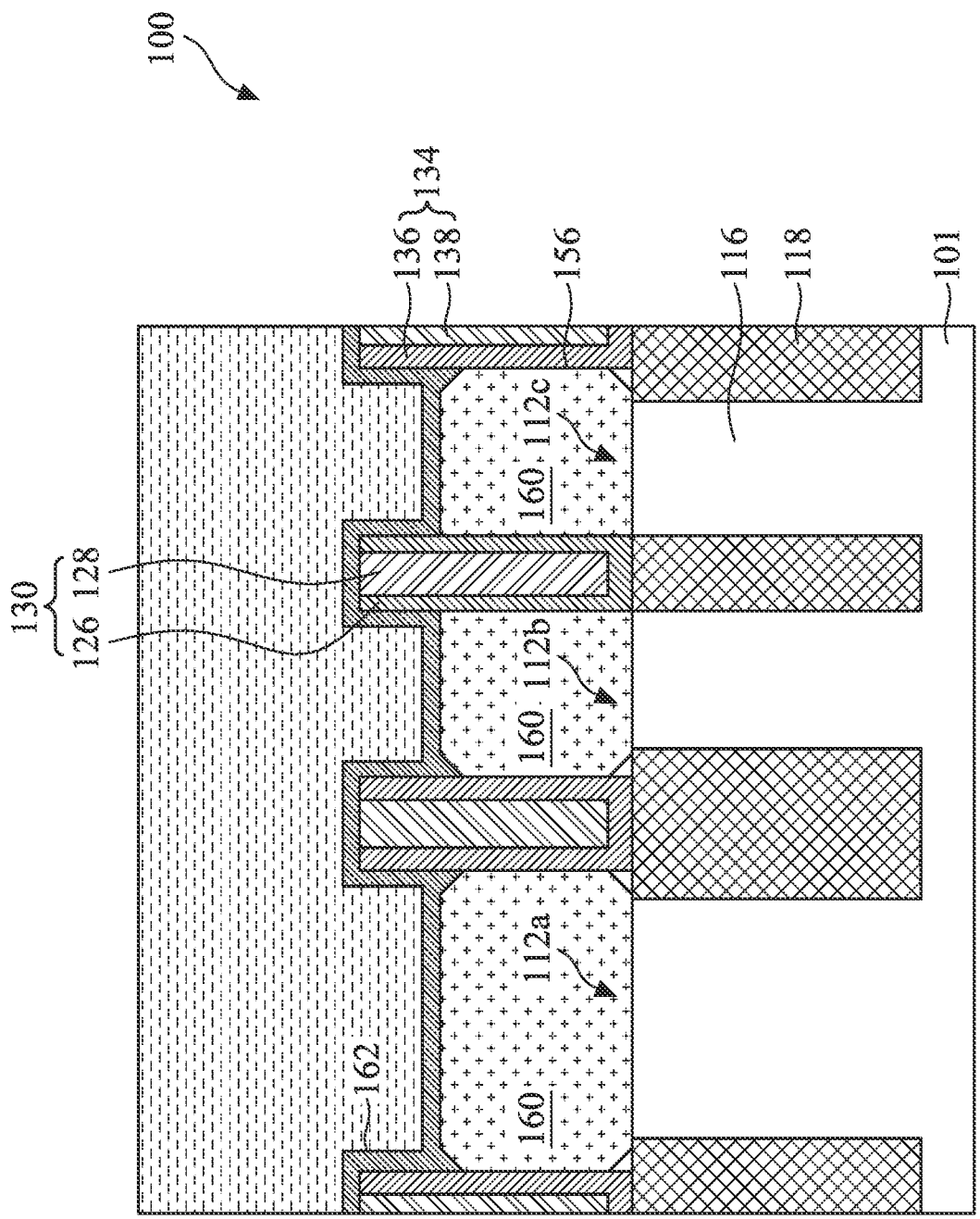
FIGS. 15A and 15B cross-sectional side views of one of the various stages of manufacturing the semiconductor device structure taken along cross-section A-A and cross-section C-C of FIG. 12A, respectively, in accordance with some embodiments.
Figure 15B:
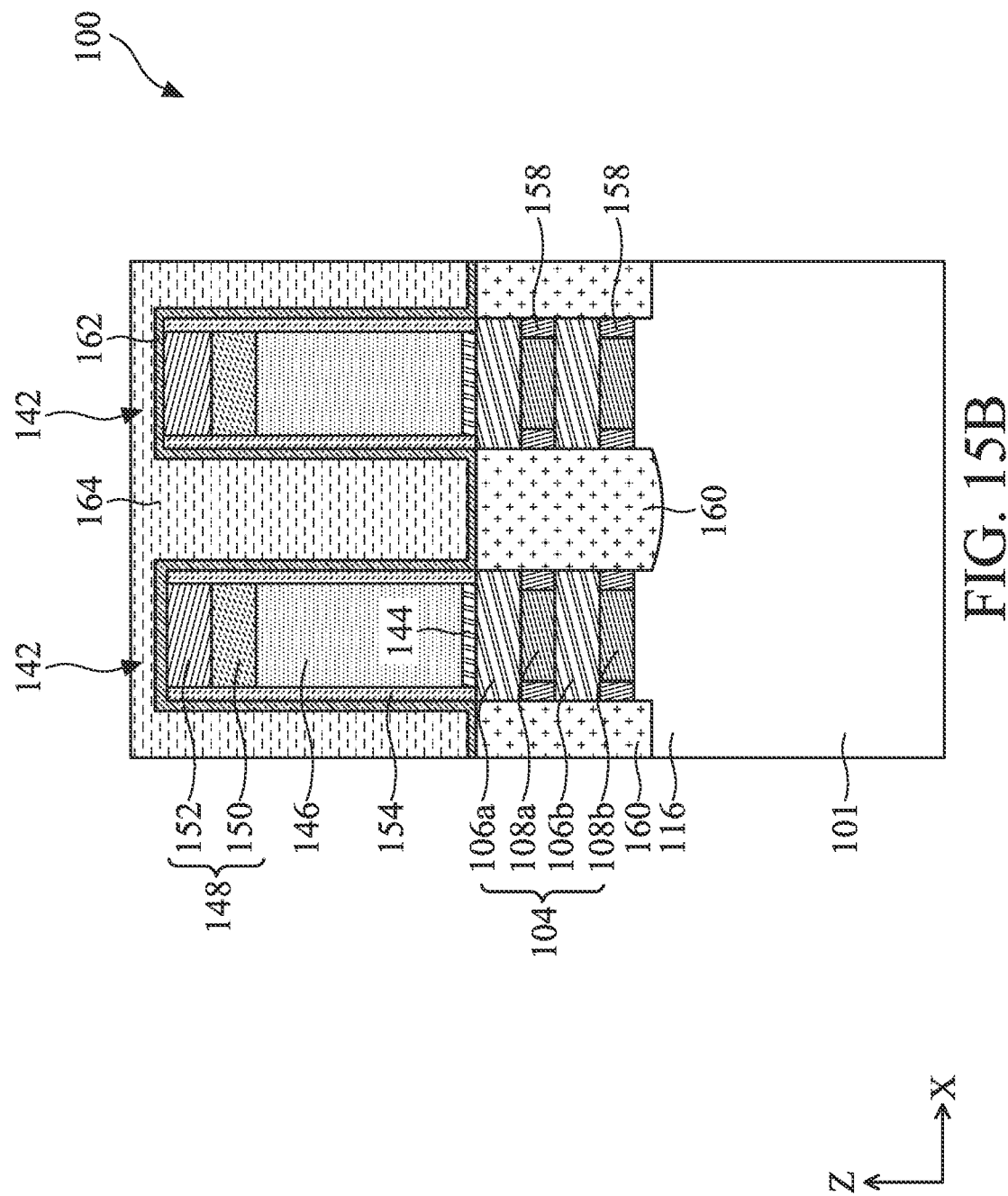

FIGS. 15A and 15B cross-sectional side views of the semiconductor device structure taken along cross-section A-A and cross-section C-C of FIG. 12A, respectively, in accordance with some embodiments. In FIGS. 15A and 15B, epitaxial S/D features 160 are formed on the well portions 116 of the fin structures 112a, 112b, 112c. The epitaxial S/D feature 160 may include one or more layers of Si, SiP, SiC and SiCP for an n-channel FET or Si, SiGe, Ge for a p-channel FET. The epitaxial S/D features 160 may grow both vertically and horizontally to form facets, which may correspond to crystalline planes of the material used for the substrate 101. The epitaxial S/D features 160 are formed by an epitaxial growth method using CVD, ALD or MBE. The epitaxial S/D features 160 are in contact with the first semiconductor layers 106 and dielectric spacers 158, as shown in FIG. 15B. The epitaxial S/D features 160 may be the S/D regions. For example, one of a pair of epitaxial S/D features 160 located on one side of the stack of semiconductor layers 104 can be a source region, and the other of the pair of epitaxial S/D features 160 located on the other side of the stack of semiconductor layers 104 can be a drain region. A pair of epitaxial S/D features 160 includes a source epitaxial feature 160 and a drain epitaxial feature 160 connected by the channels (i.e., the first semiconductor layers 106). In this disclosure, a source and a drain are interchangeably used, and the structures thereof are substantially the same.

After the formation of the epitaxial S/D features 160, a contact etch stop layer (CESL) 162 may be formed on the epitaxial S/D features 160, the first dielectric features 130, the second dielectric features 134, and the sacrificial gate stack 142, as shown in FIGS. 15A and 15B. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof. The CESL 162 may be formed by CVD, PECVD, ALD, or any suitable deposition technique. In some embodiments, the CESL 162 is a conformal layer formed by the ALD process. Next, an interlayer dielectric (ILD) layer 164 is formed on the CESL 162. The materials for the ILD layer 164 may include tetraethylorthosilicate (TEOS) oxide, un-doped silicate glass, or doped silicon oxide such as boro-phosphosilicate glass (BPSG), fused silica glass (FSG), phosphosilicate glass (PSG), boron doped silicon glass (BSG), and/or other suitable dielectric materials. The ILD layer 164 may be deposited by a PECVD process or other suitable deposition technique. In some embodiments, after formation of the ILD layer 164, the semiconductor device structure 100 may be subject to a thermal process to anneal the ILD layer 164.

Figure 16A:
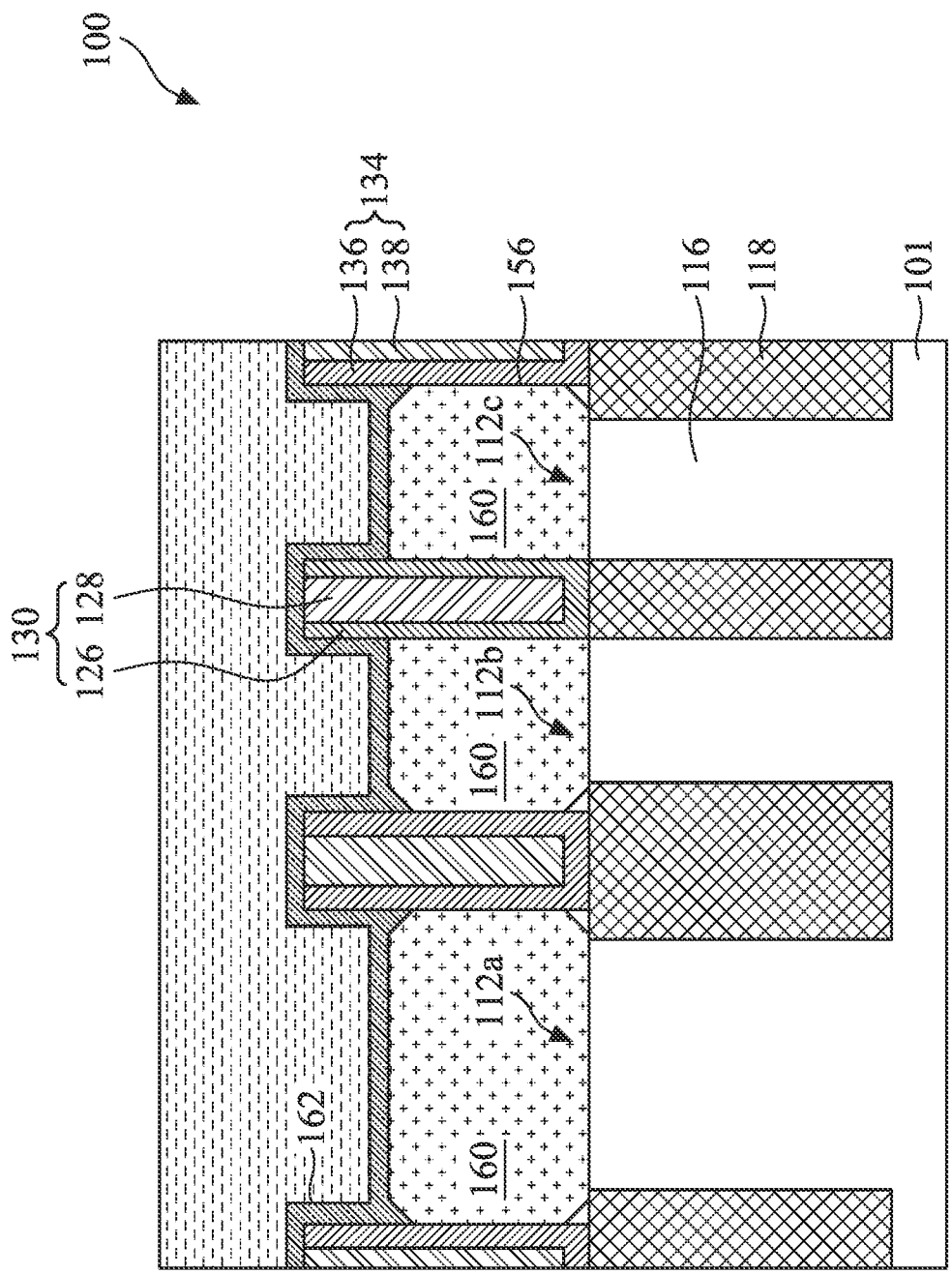
FIGS. 16A and 16B are cross-sectional side views of one of the various stages of manufacturing the semiconductor device structure taken along cross-section A-A and cross-section C-C of FIG. 12A, respectively, in accordance with some embodiments.
Figure 16B:
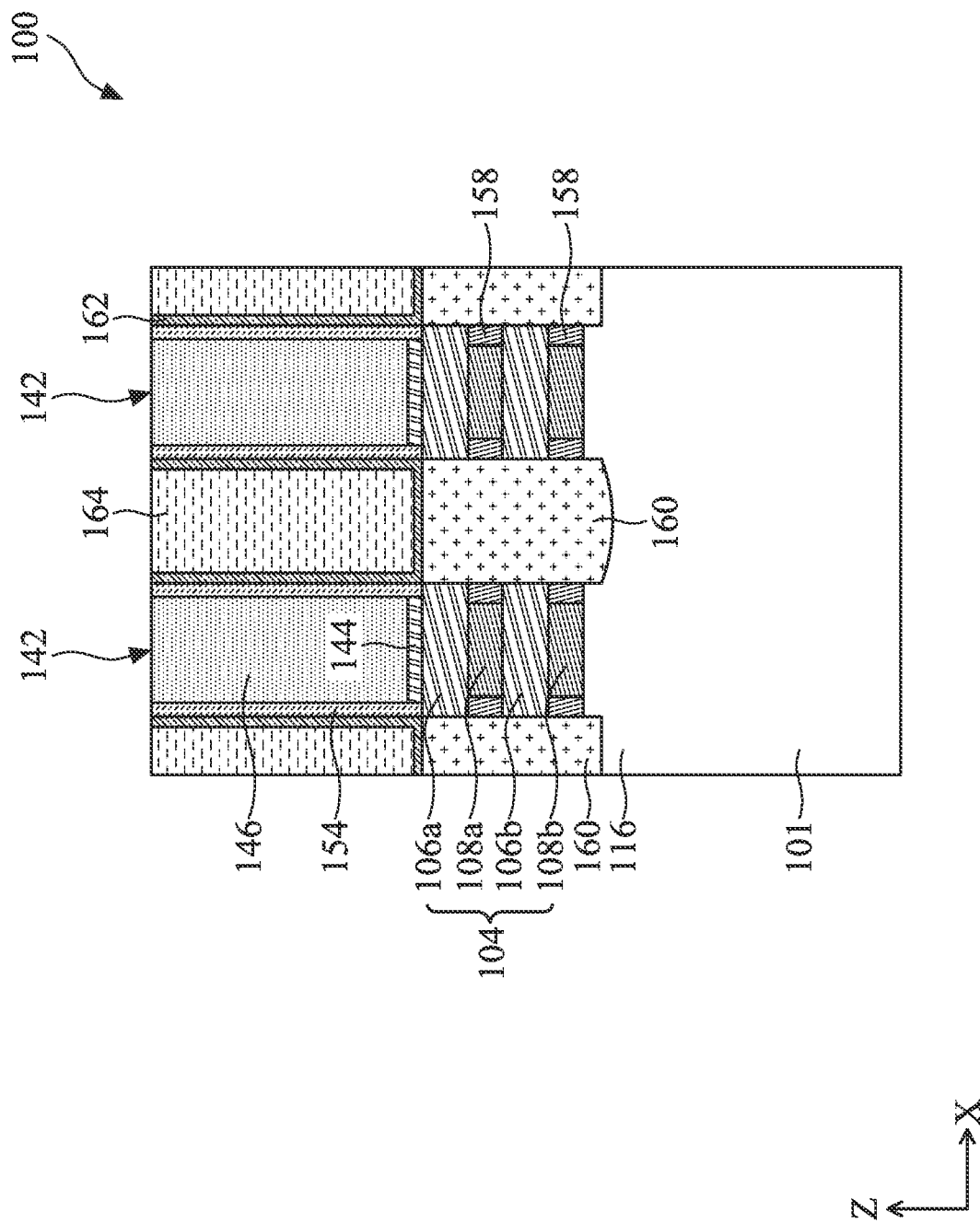

FIGS. 16A and 16B are cross-sectional side views of the semiconductor device structure taken along cross-section A-A and cross-section C-C of FIG. 12A, respectively, in accordance with some embodiments. In FIGS. 16A and 16B, a planarization process is performed to expose the sacrificial gate electrode layer 146. The planarization process may be any suitable process, such as a CMP process. The planarization process removes portions of the ILD layer 164 and the CESL 162 disposed on the sacrificial gate stacks 142. The ILD layer 164 may be recessed to a level below the top of the sacrificial gate electrode layer 146. In some cases, a nitrogen-containing layer (not shown), such as a SiCN layer, may be formed on the recessed ILD layer 164 to protect the ILD layer 164 during subsequent etch processes.

Figure 17A:
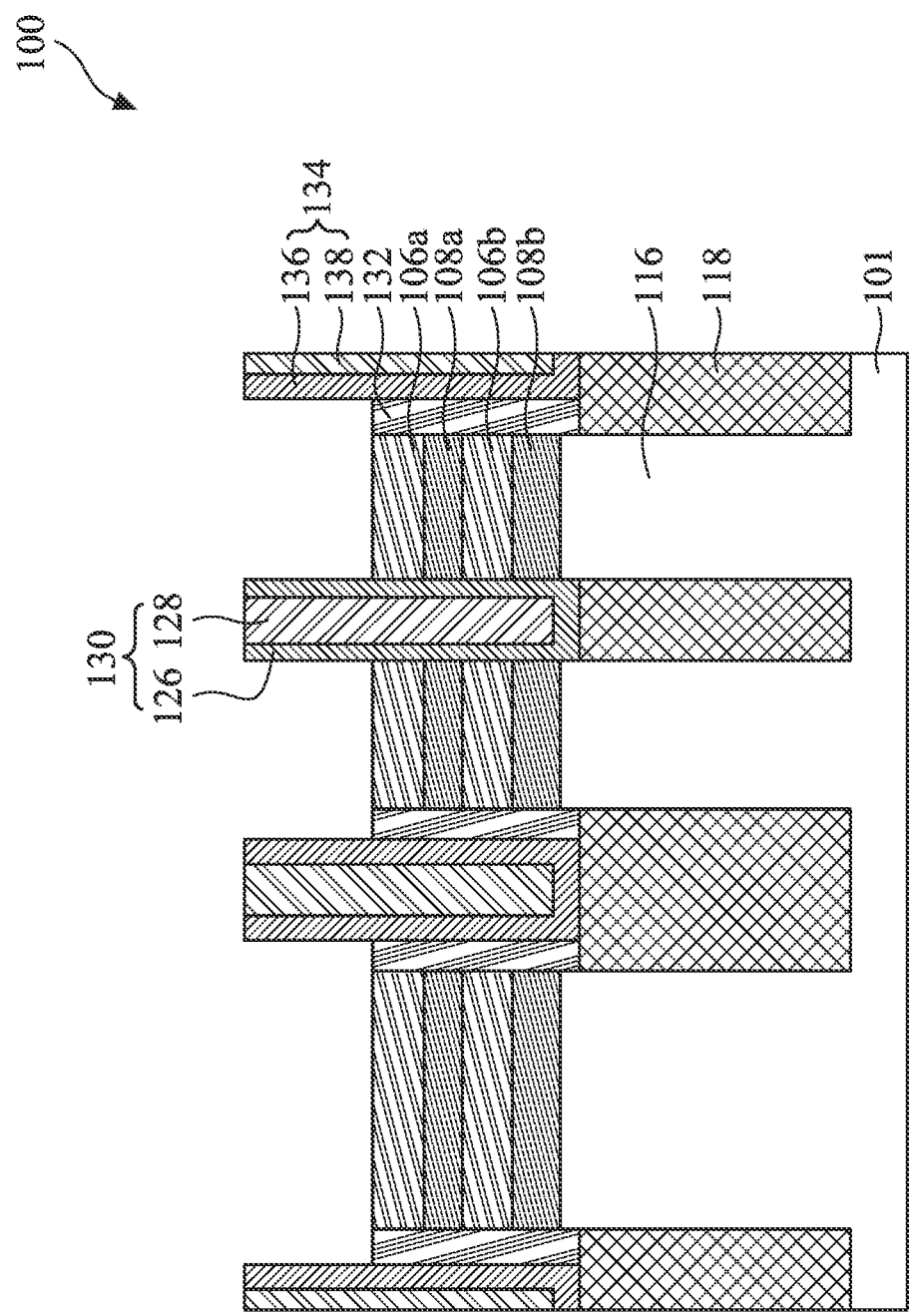
FIGS. 17A and 17B are cross-sectional side views of one of the various stages of manufacturing the semiconductor device structure taken along cross-section B-B and cross-section C-C of FIG. 12A, respectively, in accordance with some embodiments.
Figure 17B:
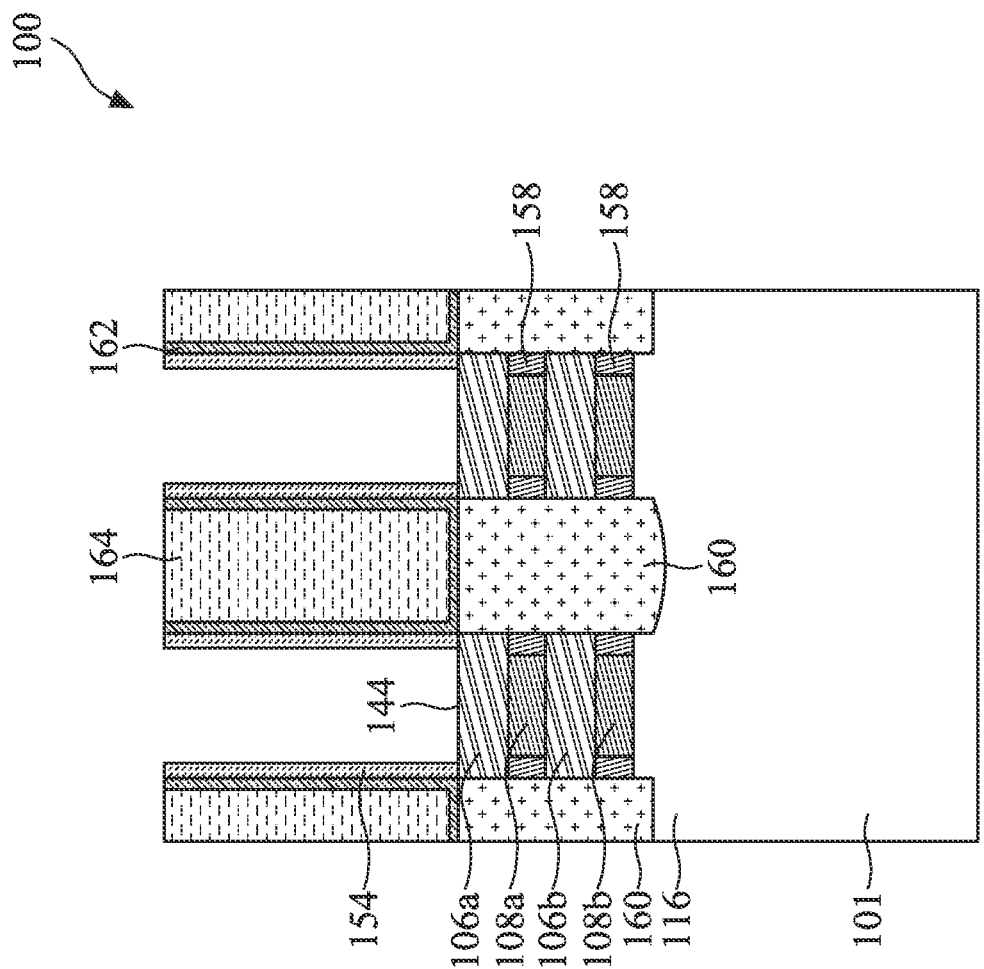

FIGS. 17A and 17B are cross-sectional side views of the semiconductor device structure 100 taken along cross-section B-B and cross-section C-C of FIG. 12A, respectively, in accordance with some embodiments. As shown in FIGS. 17A and 17B, the sacrificial gate electrode layer 146 (FIG. 16B) and the sacrificial gate dielectric layer 144 (FIG. 16B) are removed, exposing the top surfaces of the cladding layers 132 and the stacks of semiconductor layers 104. The sacrificial gate electrode layer 146 may be first removed by any suitable process, such as dry etch, wet etch, or a combination thereof, followed by the removal of the sacrificial gate dielectric layer 144, which may be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 146 but not the spacers 154, the first dielectric features 130, the second dielectric features 134, and the CESL 162.

Figure 18A:
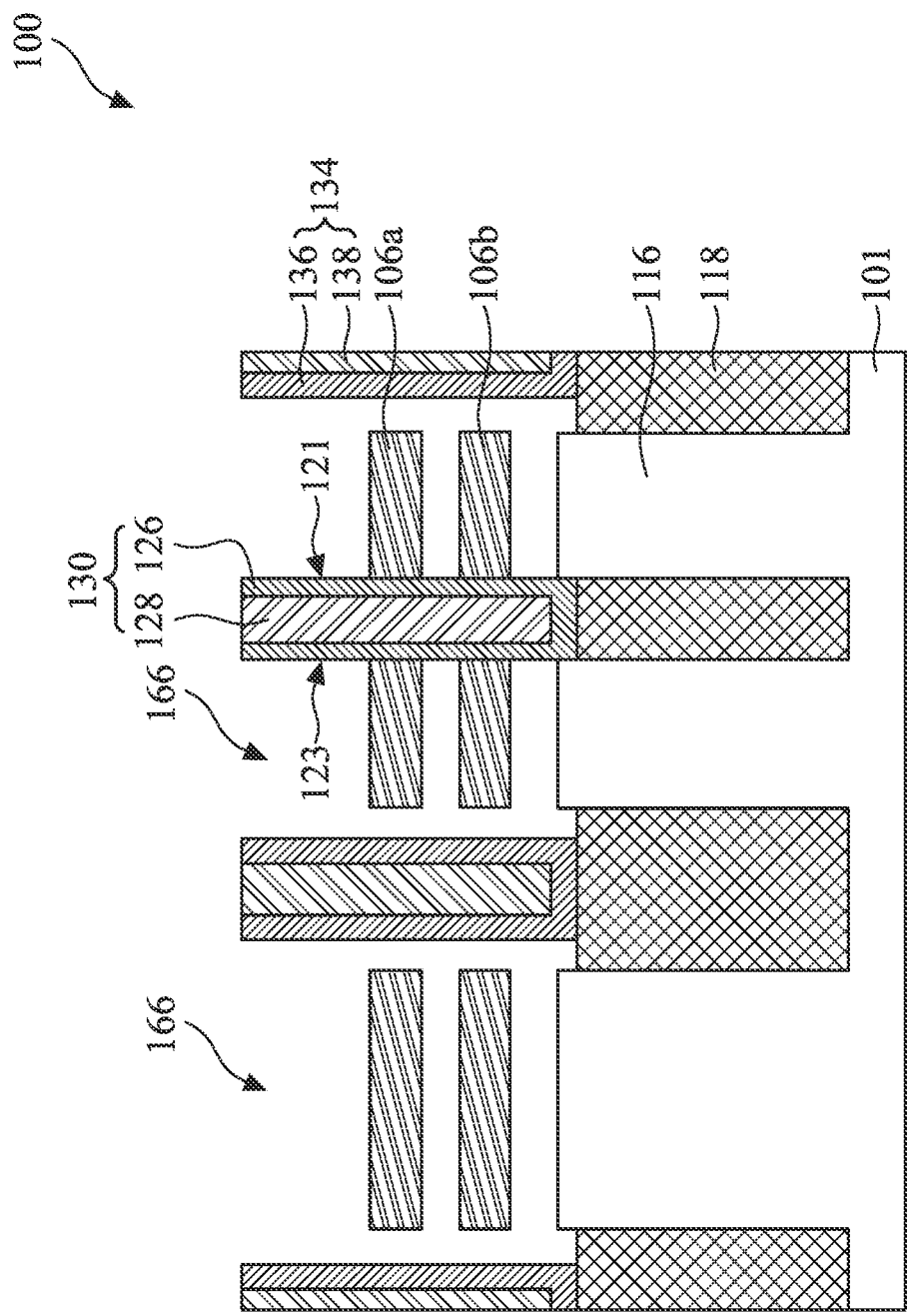
FIGS. 18A and 18B are cross-sectional side views of one of the various stages of manufacturing the semiconductor device structure 100 taken along cross-section B-B and cross-section C-C of FIG. 12A, respectively, in accordance with some embodiments.
Figure 18B:
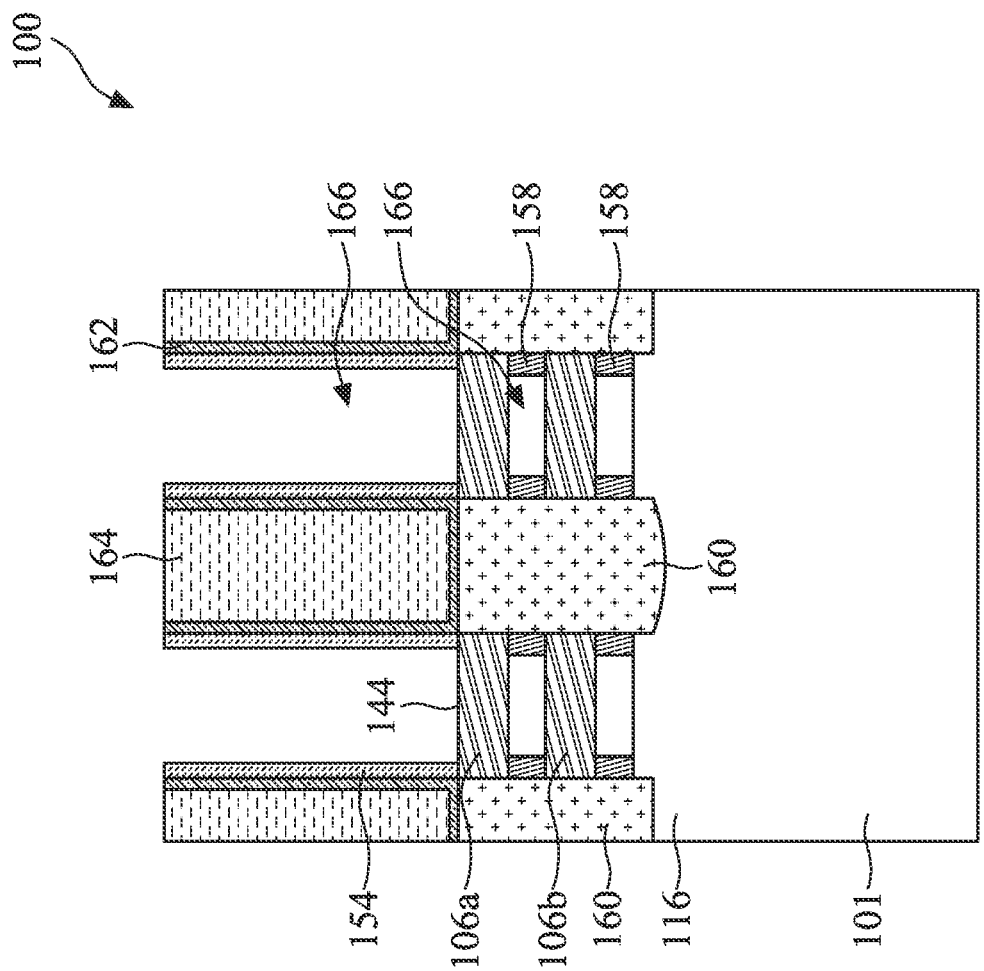

FIGS. 18A and 18B are cross-sectional side views of the semiconductor device structure 100 taken along cross-section B-B and cross-section C-C of FIG. 12A, respectively, in accordance with some embodiments. As shown in FIGS. 18A and 18B, the cladding layers 132 and the second semiconductor layers 108 are removed. The removal process exposes the dielectric spacers 158 and the first semiconductor layers 106. The removal process may be any suitable processes, such as dry etch, wet etch, or a combination thereof. The removal process may be a selective etch process that removes the cladding layers 132 and the second semiconductor layers 108 but not the first semiconductor layers 106, the spacers 154, the first dielectric features 130, the second dielectric features 134, and the CESL 162. In cases where the cladding layers 132 and the second semiconductor layers 108 are made of SiGe, and the first semiconductor layers 106 are made of silicon, a selective wet etching including an ammonia and hydrogen peroxide mixtures (APM) may be used. As a result of the etch process, openings 166 are formed, leaving the first semiconductor layers 106 (e.g., first semiconductor layers 106a, 106b) protruded from a first side 121 and a second side 123 (opposing the first side 121) of the first dielectric feature 130. Specifically, each of the first semiconductor layers 106a, 106b has a first end in contact with the first dielectric layer 126 and a second end extending away from the first end, as shown in FIGS. 18A and 18B. The portion of the first semiconductor layers 106 not covered by the dielectric spacers 158 may be exposed in the openings 166. Each first semiconductor layer 106 serves as a nanosheet channel of the nanosheet transistor/fork-like gate nanosheet transistor.

Figure 19A:
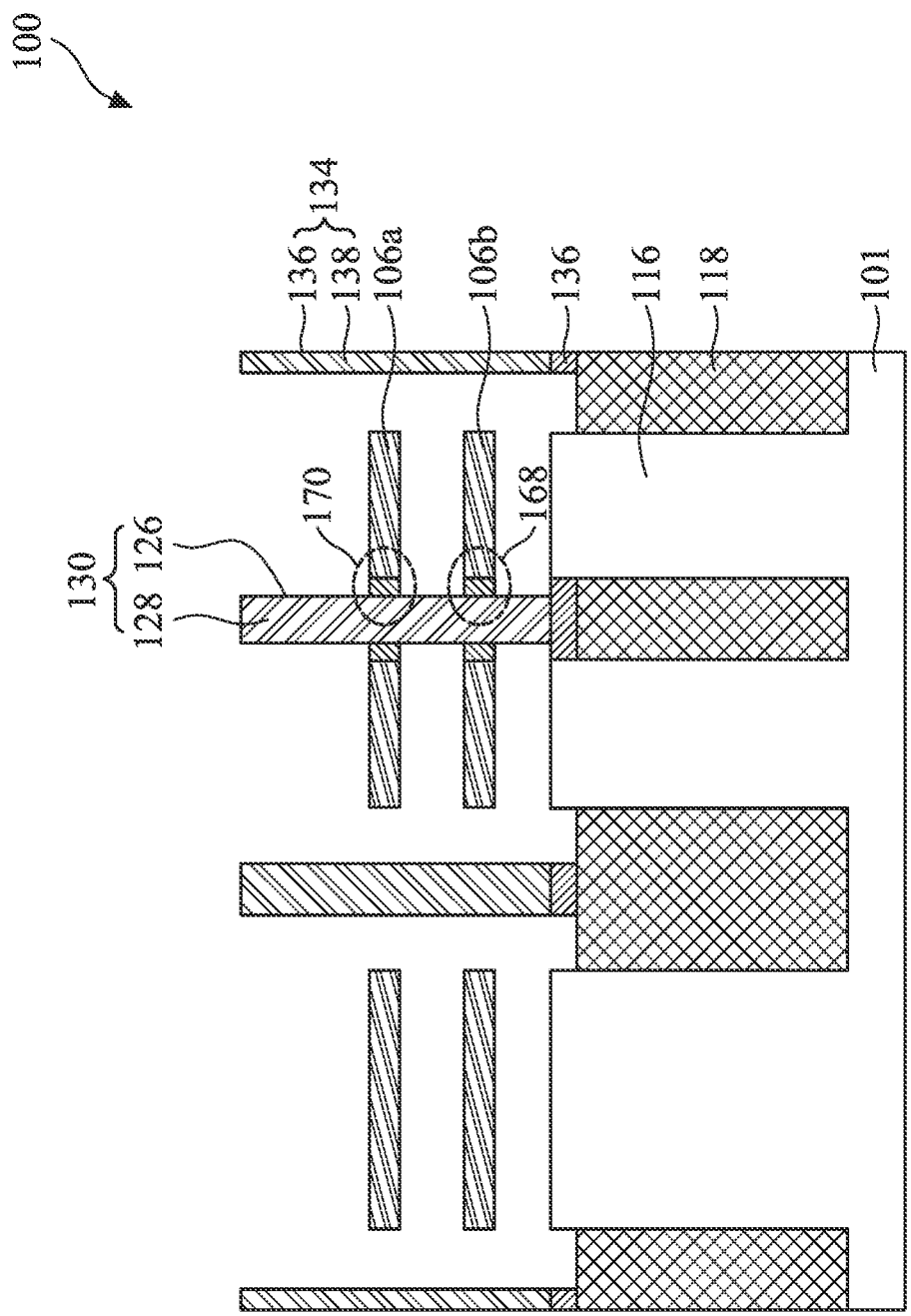
FIG. 19A is a cross-sectional view of one of the various stages of manufacturing the semiconductor device structure taken along cross-section B-B of FIG. 12A in accordance with some embodiments.
Figure 19B:
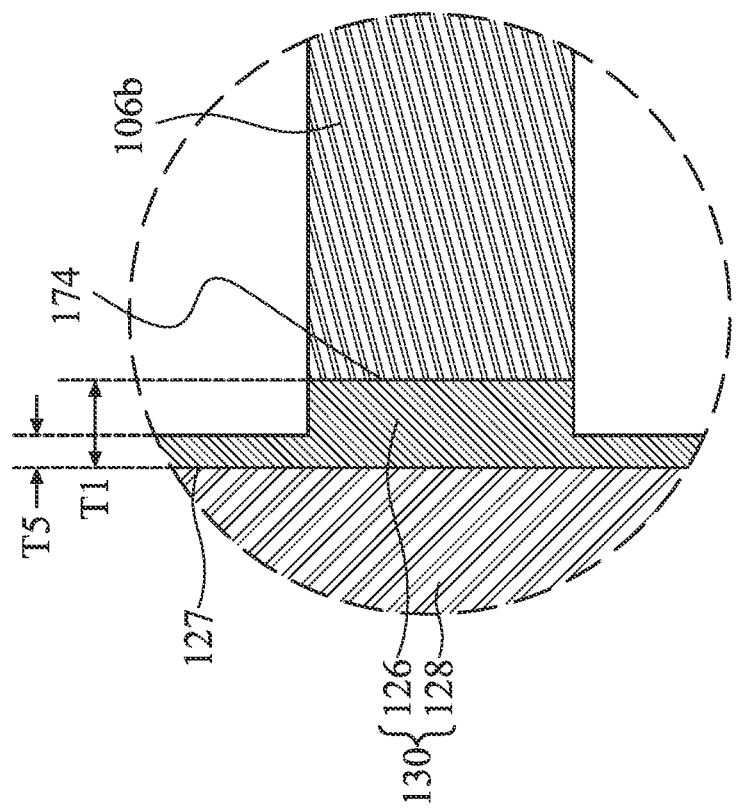
FIG. 19B illustrates an enlarged view of area of a portion of the semiconductor device structure shown in FIG. 19A according to some embodiments.

FIG. 19A is a cross-sectional view of the semiconductor device structure 100 taken along cross-section B-B of FIG. 12A in accordance with some embodiments. As shown in FIG. 19A, after the removal of the cladding layers 132 and the second semiconductor layers 108, the first dielectric layer 126 and the third dielectric layer 136 are recessed by a removal process. The removal process is a controlled isotropic process so that portions of the first dielectric layer 126 on exposed surfaces (e.g., sidewalls 127a, 127b) of the second dielectric layer 128 are removed, while the first dielectric layer 126 between the second dielectric layer 128 and the first semiconductor layers 106a remains substantially intact. FIG. 19B illustrates an enlarged view of area 168 of a portion of the semiconductor device structure 100 shown in FIG. 19A according to some embodiments. As can be seen, the first dielectric layer 126 disposed between the second dielectric layer 128 and the first semiconductor layers 106a has the first thickness T1, and the first dielectric layer 126 on the exposed sidewalls 127 of the second dielectric layer 128 have a fifth thickness T5 that is less than the first thickness T1 (FIG. 7). The ratio of the first thickness T1 to the fifth thickness T5 may be in a range of about 2:1 to about 6:1. In some embodiments, the fifth thickness T5 is about 1 nm to about 5 nm less than the first thickness T1.

Figure 19C:
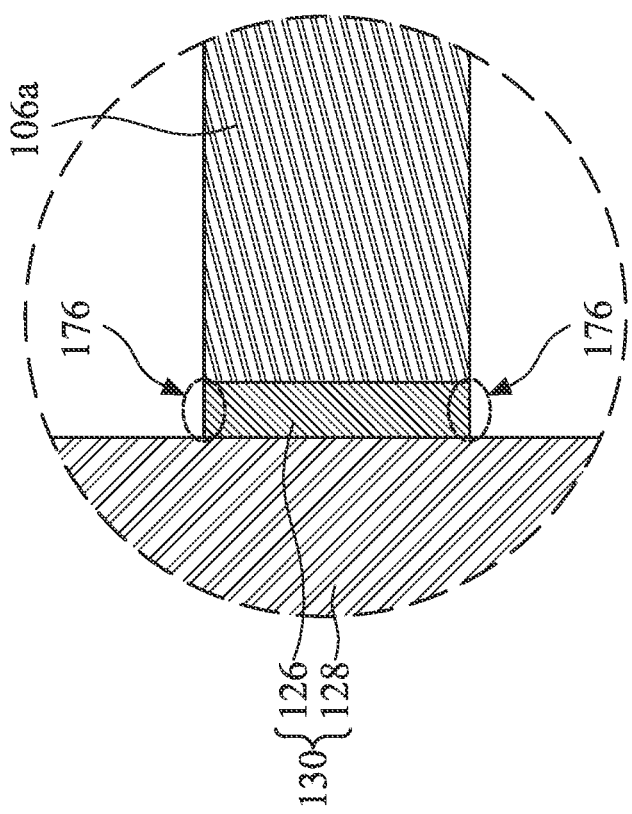
FIG. 19C illustrates an enlarged view of area of a portion of the semiconductor device structure shown in FIG. 19A according to some embodiments.

In some embodiments, portions of the first dielectric layer 126 not in contact with the first semiconductor layers 106a are entirely removed by the removal process, as shown in FIG. 19C. Due to the isotropic removal process, an edge portion of the first dielectric layer 126 (indicated by a dashed circle 176) between the second dielectric layer 128 and the first semiconductor layers 106a may also be removed, forming a notch or recess near an interface 174 between the first dielectric layer 126 and the first semiconductor layers 106a. The notch or recess allows the gate electrode layer 182 to provide greater surface coverage around the first semiconductor layer 106b and thus better electrical control over the nanosheet channels (e.g., first semiconductor layers 106a, 106b).

In some embodiments, portions of the third dielectric layer 136 are simultaneously removed during the recess of the first dielectric layer 126. In some embodiments, exposed portions of the third dielectric layer 136 are entirely removed as a result of the removal process.

In either case, the lateral recess or removal of the first dielectric layer 126 increases the surface coverage of the gate electrode layer 182 (FIG. 21A) around the first semiconductor layer 106b. Particularly, the gate electrode layer 182 extends towards the second dielectric layer 128 and over a plane defined by the interface 174 between the first dielectric layer 126 and the first semiconductor layers 106a. For example, the thickness of a high-K (HK) dielectric layer 180 (FIG. 20) may be less than the difference between the thickness T1 and the thickness T5. Thus, the gate electrode layer 182 may extend over the plane defined by the interface 174. Since the gate electrode layer 182 provides greater surface coverage around the first semiconductor layer 106b, a better electrical control over the nanosheet channels (e.g., first semiconductor layers 106a, 106b) is achieved and thus leakage in the off state is reduced. Therefore, if the ratio of the first thickness T1 to the fifth thickness T5 is less than about 2:1, the extension of the gate electrode layer 182 might not be sufficient to provide desired electrical control over the nanosheet channels. On the other hand, if the ratio of the first thickness T1 to the fifth thickness T5 is greater than about 6:1, the manufacturing cost is increased without significant advantage.

The removal process used to remove the first dielectric layer 126 and the third dielectric layer 136 may be any suitable processes, such as dry etch, wet etch, or a combination thereof. In cases where the first dielectric layer 126 and the third dielectric layer 136 are formed of the same material (e.g., SiOC), the removal process may be a selective etch process that removes the first dielectric layer 126 and the third dielectric layer 136 but not the first semiconductor layers 106, the spacers 154, second dielectric layer 128 and the fourth dielectric layer 138, and the CESL 162.

Figure 20:
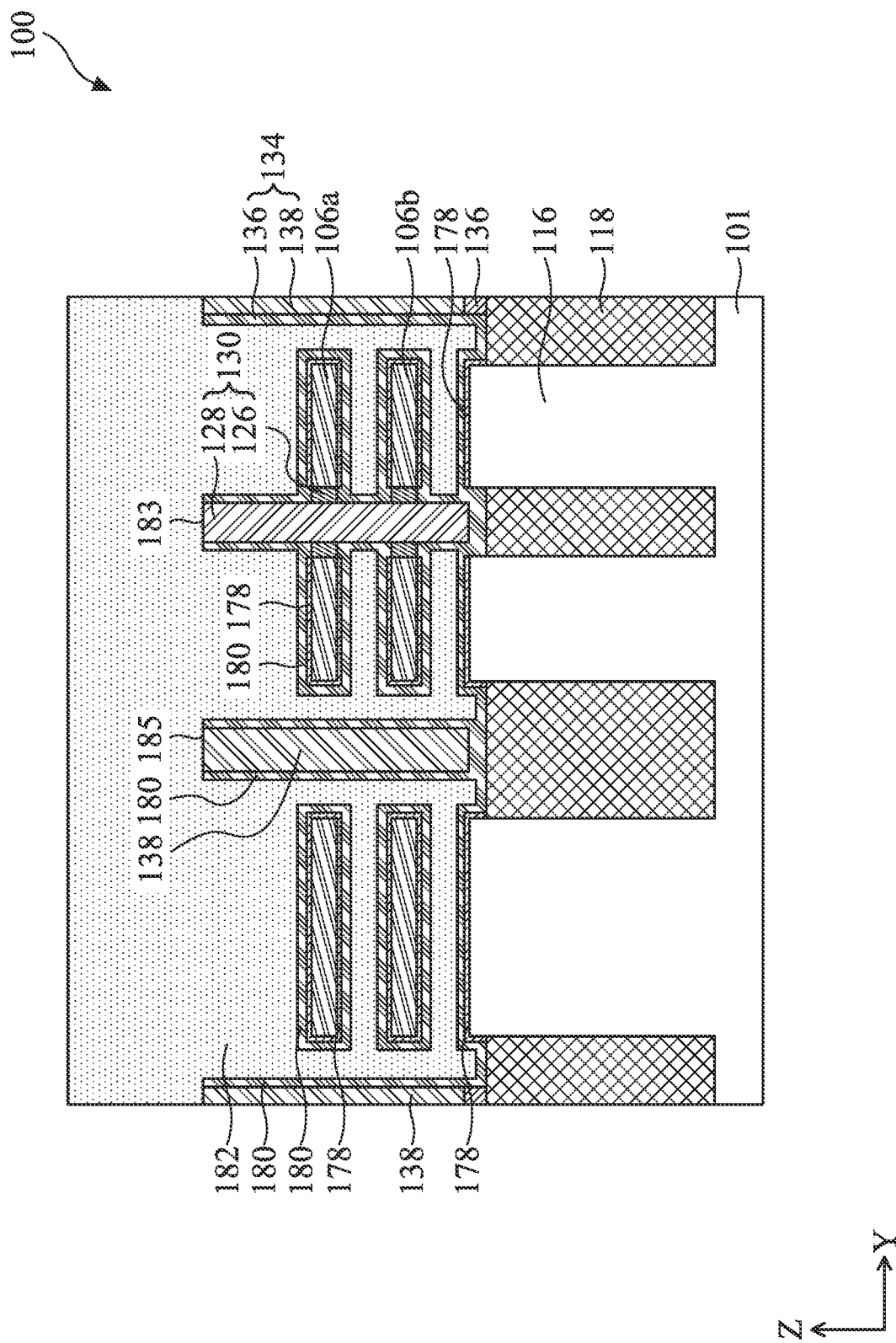
FIG. 20 is a cross-sectional view of one of the various stages of manufacturing the semiconductor device structure taken along cross-section B-B of FIG. 12A in accordance with some embodiments.

FIG. 20 is a cross-sectional view of the semiconductor device structure 100 taken along cross-section B-B of FIG. 12A in accordance with some embodiments. As shown in FIG. 20, an interfacial layer (IL) 178 is formed to surround at least three surfaces (except for the surface being in contact with the first dielectric layer 126) of the first semiconductor layers 106 (e.g., first semiconductor layers 106a, 106b). In some embodiments, the IL 178 may form on the first semiconductor layers 106 but not the first dielectric layer 126. In some embodiments, the IL 178 may also form on the exposed surfaces of the well portion 116 of the substrate 101. The IL 178 may include or be made of an oxygen-containing material or a silicon-containing material, such as silicon oxide, silicon oxynitride, oxynitride, hafnium silicate, etc. The IL 178 may be formed by CVD, ALD or any suitable conformal deposition technique. In one embodiment, the IL 178 is formed using ALD. The thickness of the IL 148 is chosen based on device performance considerations. In some embodiments, the IL 148 has a thickness ranging from about 0.5 nm to about 2 nm.

Figure 24A:
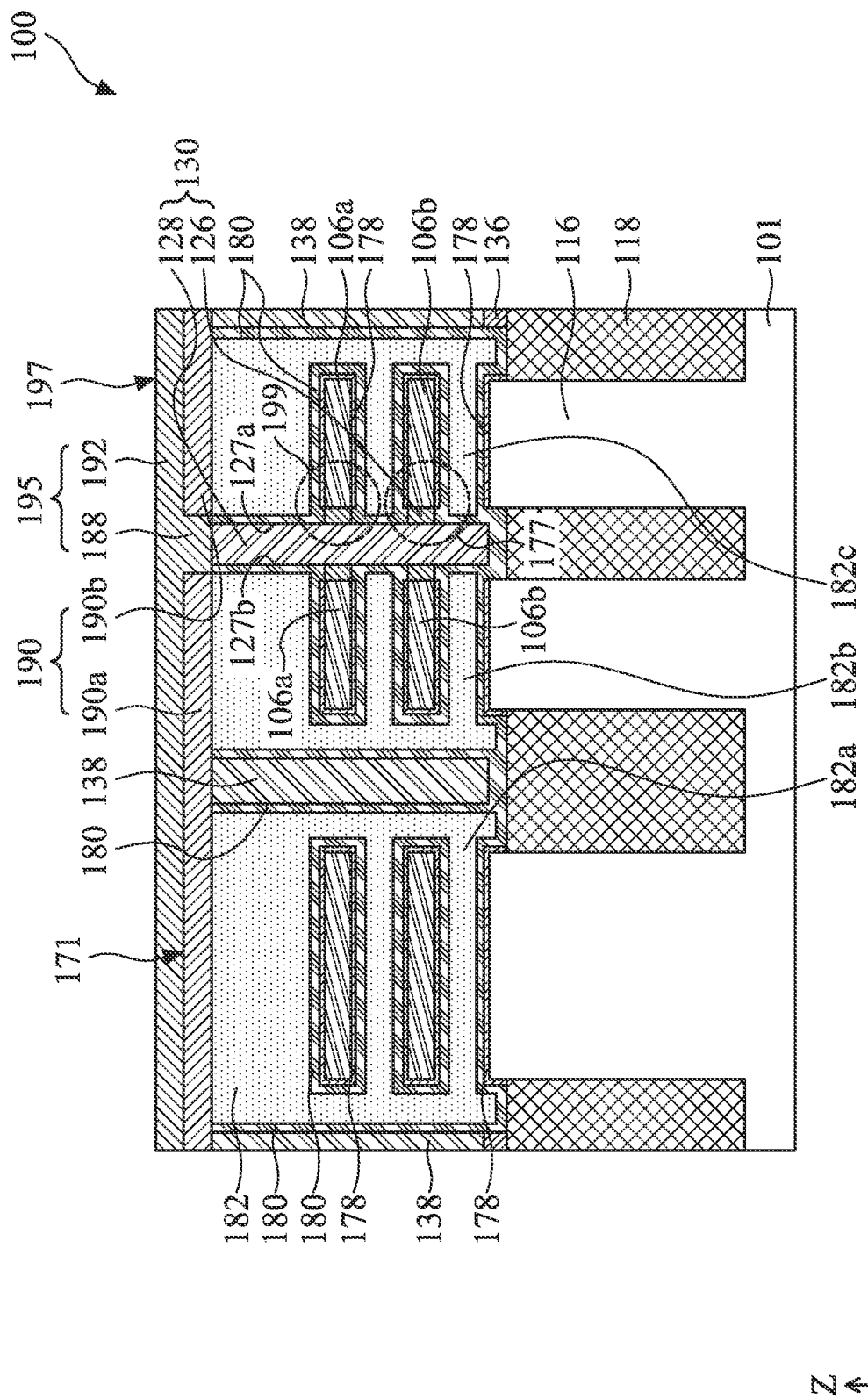
FIGS. 24A-24E are cross-sectional view of one of the various stages of manufacturing the semiconductor device structure taken along cross-sections B-B, D-D, E-E of FIG. 12A, respectively, in accordance with some embodiments.
Figure 24B:
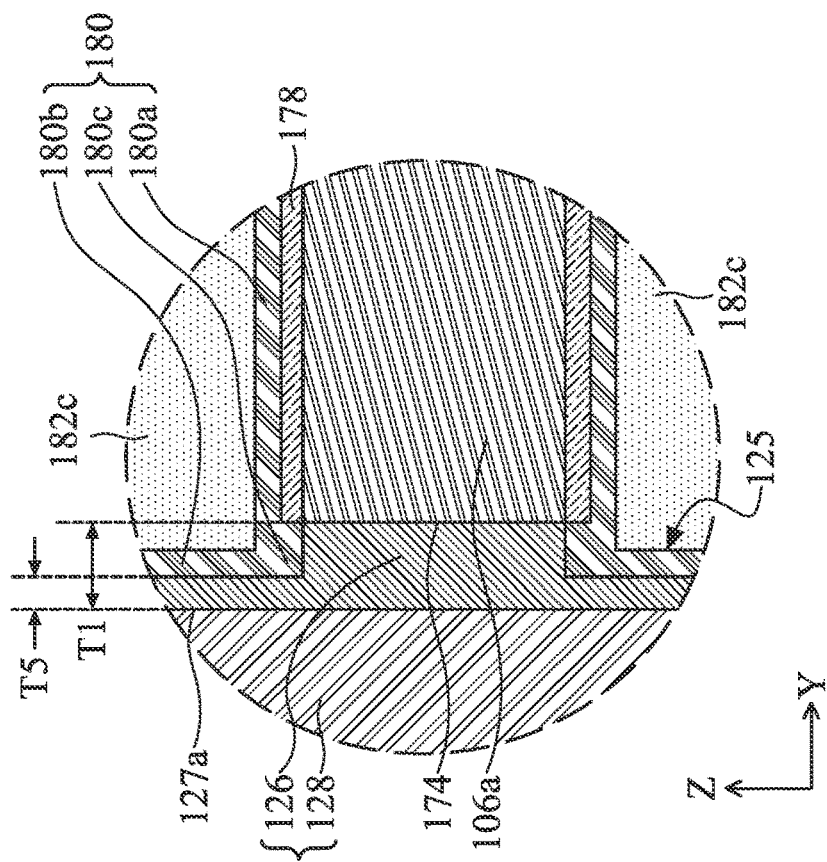

Next, a high-K (HK) dielectric layer 180 is formed on the exposed surfaces of the semiconductor device structure 100. In some embodiments, the HK dielectric layer 180 is formed on the IL 178, the insulating material 118, and on the exposed surfaces of the first and second dielectric features 130, 134 (e.g., the first dielectric layers 126 and the third dielectric layers 136), as shown in FIGS. 24A and 24B. The HK dielectric layer 180 may include or made of hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k materials. In some embodiments, the HK dielectric layer 180 may include or made of the same material as the sacrificial gate dielectric layer 144. The HK dielectric layer 180 may be a conformal layer formed by a conformal process, such as an ALD process or a CVD process. The HK dielectric layer 180 may have a thickness of about 0.5 nm to about 3 nm, which may vary depending on the application.

Figure 21A:
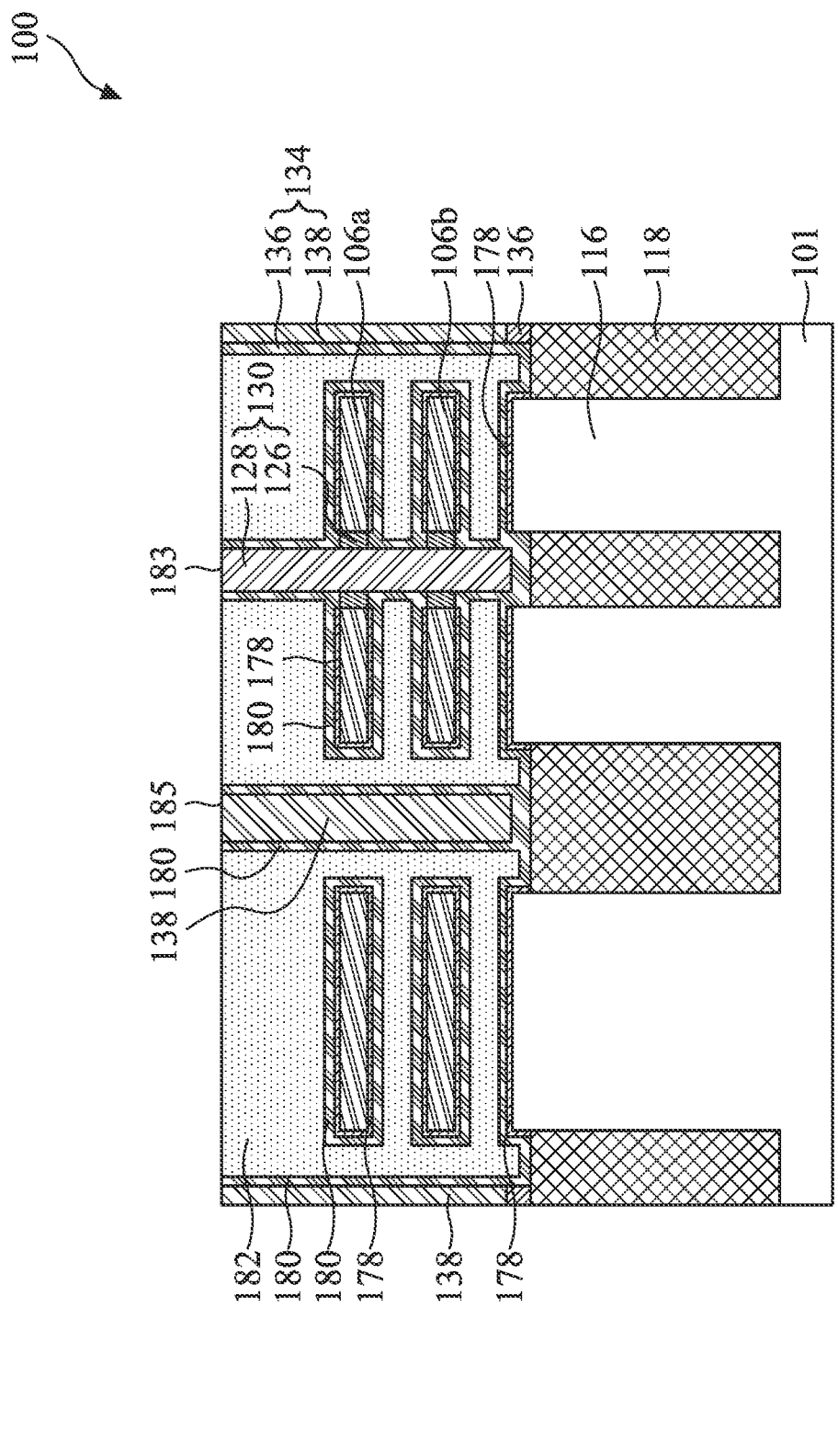
FIG. 21A is a cross-sectional view of one of the various stages of manufacturing the semiconductor device structure taken along cross-section B-B of FIG. 12A in accordance with some embodiments.
Figure 21B:
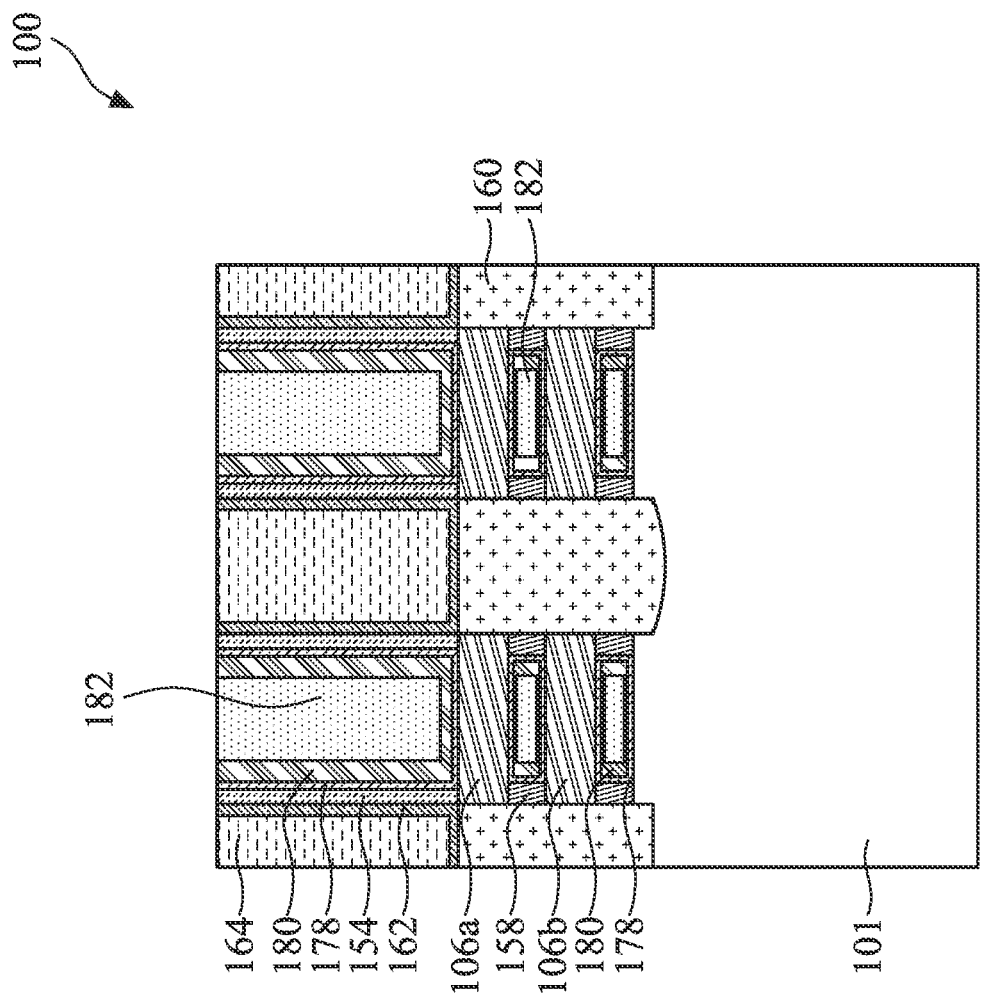
FIG. 21B is a cross-sectional side view of one of the various stages of manufacturing the semiconductor device structure taken along cross-section C-C of FIG. 12A in accordance with some embodiments.

FIG. 21A is a cross-sectional view of the semiconductor device structure 100 taken along cross-section B-B of FIG. 12A in accordance with some embodiments. FIG. 21B is a cross-sectional side view of the semiconductor device structure 100 taken along cross-section C-C of FIG. 12A in accordance with some embodiments. In FIG. 21A, after the formation of the IL 178 and the HK dielectric layer 180, a gate electrode layer 182 is formed in the space defined between two adjacent dielectric features (e.g., between the first and second dielectric features 130, 134, between two adjacent first dielectric features 130, or between two adjacent second dielectric features 134). The gate electrode layer 182 is formed on the HK dielectric layer 180 to surround a portion of each first semiconductor layer 106a, 106b and on the HK dielectric layer 180 that is in contact with the first and second dielectric features 130, 134 and the insulating material 118. The gate electrode layer 182 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 182 may be formed by PVD, CVD, ALD, electro-plating, or other suitable method. The gate electrode layer 182 may be also deposited over the first and second dielectric features 130, 134.

Figure 22A:
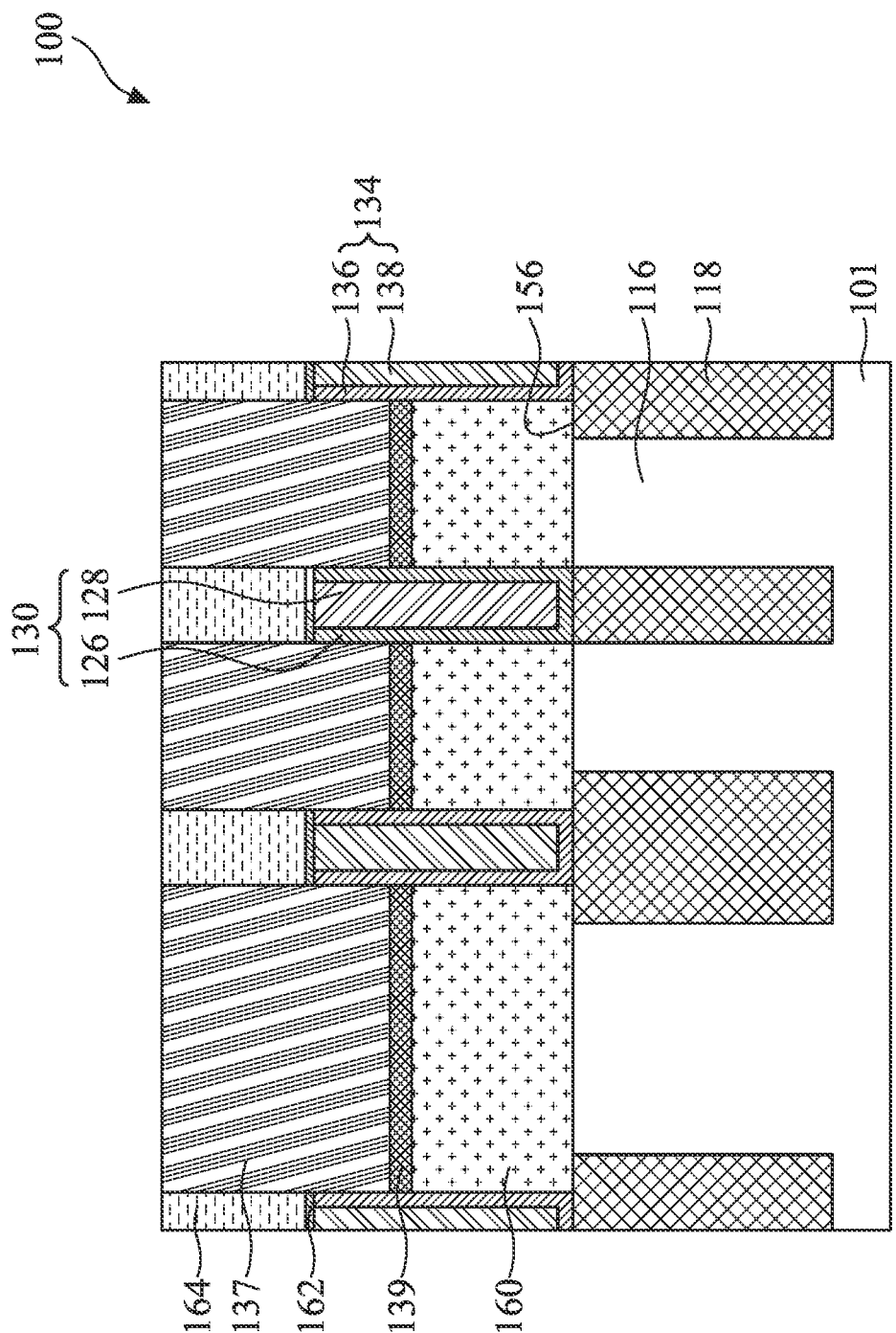
FIGS. 22A and 22B are cross-sectional side views of one of the various stages of manufacturing the semiconductor device structure taken along cross-section A-A and cross-section C-C of FIG. 12A, respectively, in accordance with some embodiments.
Figure 22B:
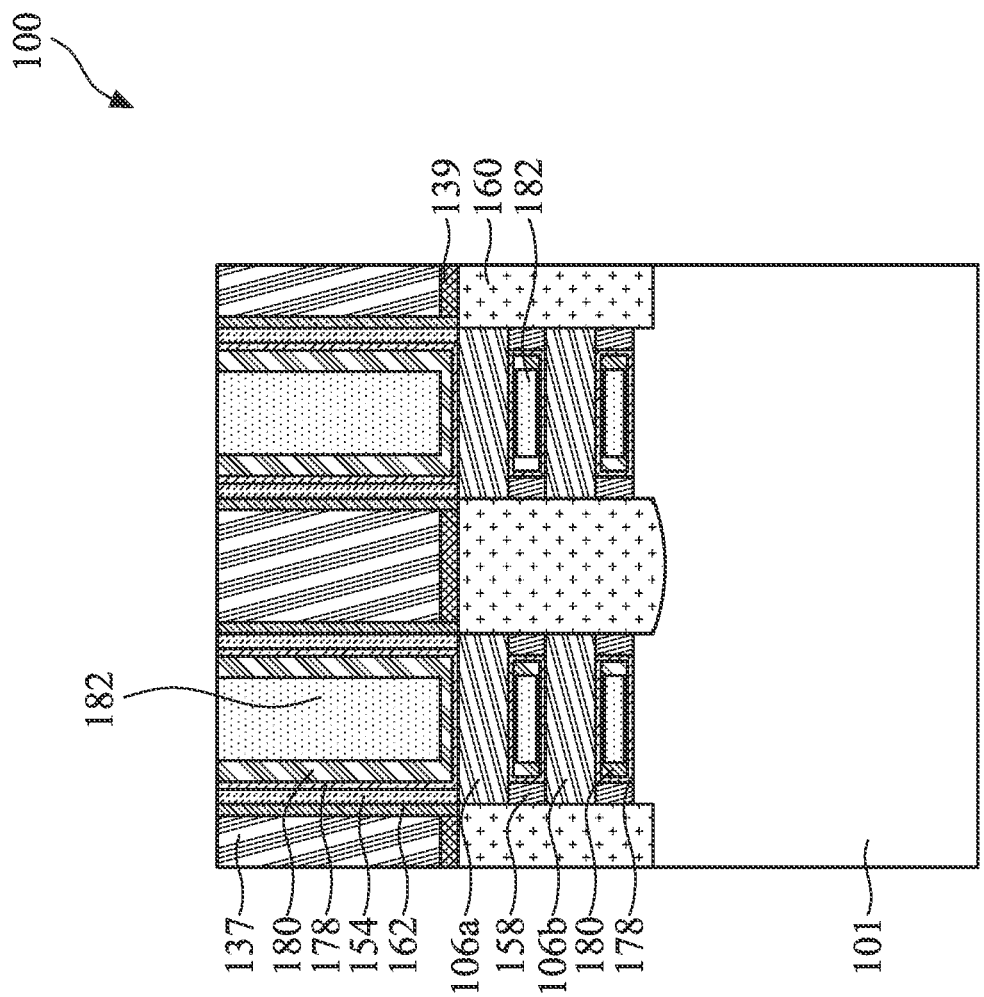

FIGS. 22A and 22B are cross-sectional side views of the semiconductor device structure taken along cross-section A-A and cross-section C-C of FIG. 12A, respectively, in accordance with some embodiments. In FIGS. 22A and 22B, conductive features 137 are formed through the ILD layer 164 and the CESL 162 to be in contact with the epitaxial S/D features 160 via a silicide layer 139. The conductive features 137 may be made of a material including one or more of Ru, Mo, Co, Ni. W, T1, Ta, Cu, Al, TiN and TaN. The silicide layers 139 may be made of a metal or metal alloy silicide, and the metal includes a noble metal, a refractory metal, a rare earth metal, alloys thereof, or combinations thereof. Once the conductive features 137 are formed, a planarization process, such as CMP, is performed to expose the top surface of the gate electrode layer 182, as shown in FIG. 22B.

Figure 23A:
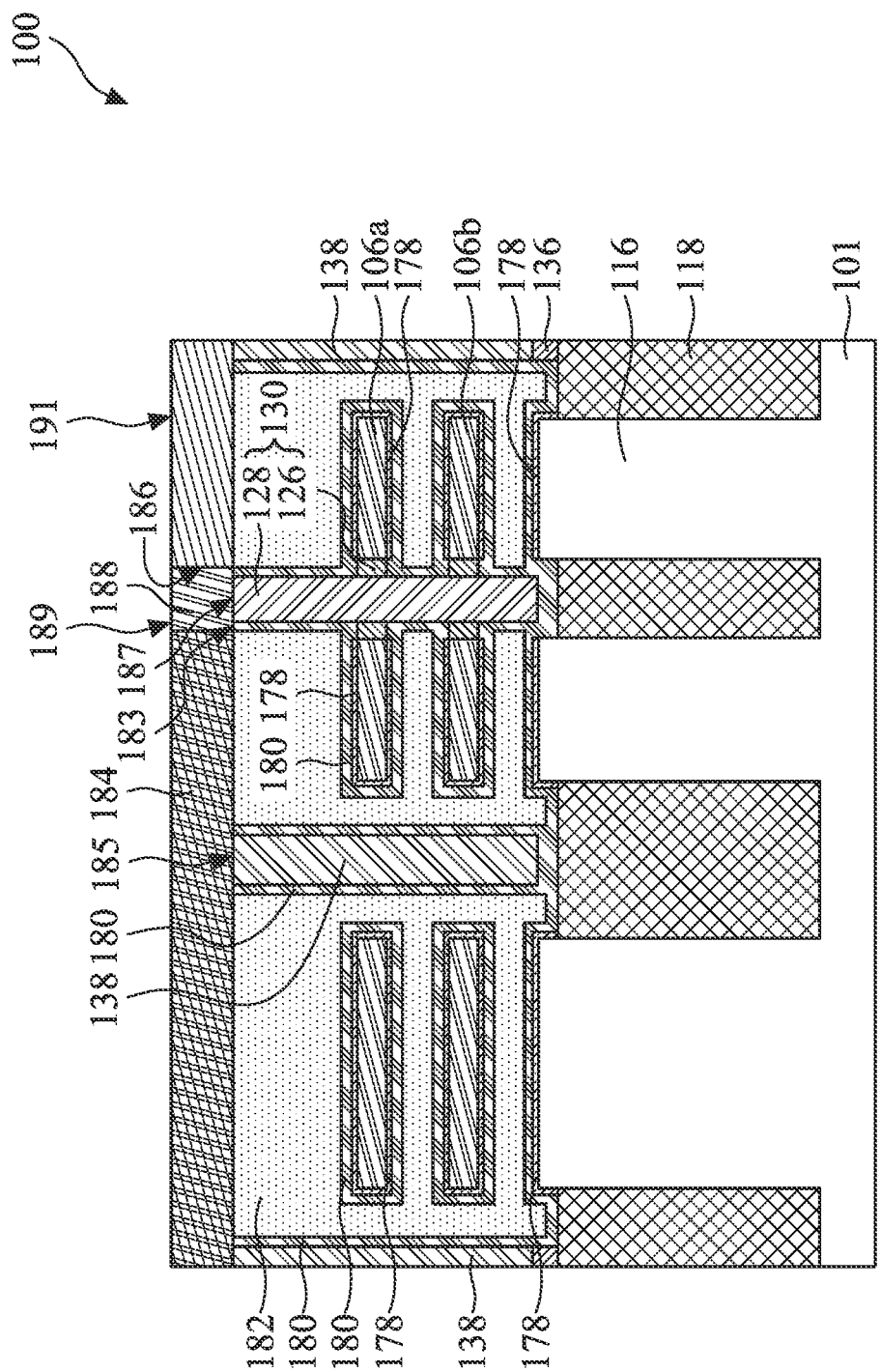
FIG. 23A is a cross-sectional view of one of the various stages of manufacturing the semiconductor device structure taken along cross-section B-B of FIG. 12A in accordance with some embodiments.
Figure 23B:
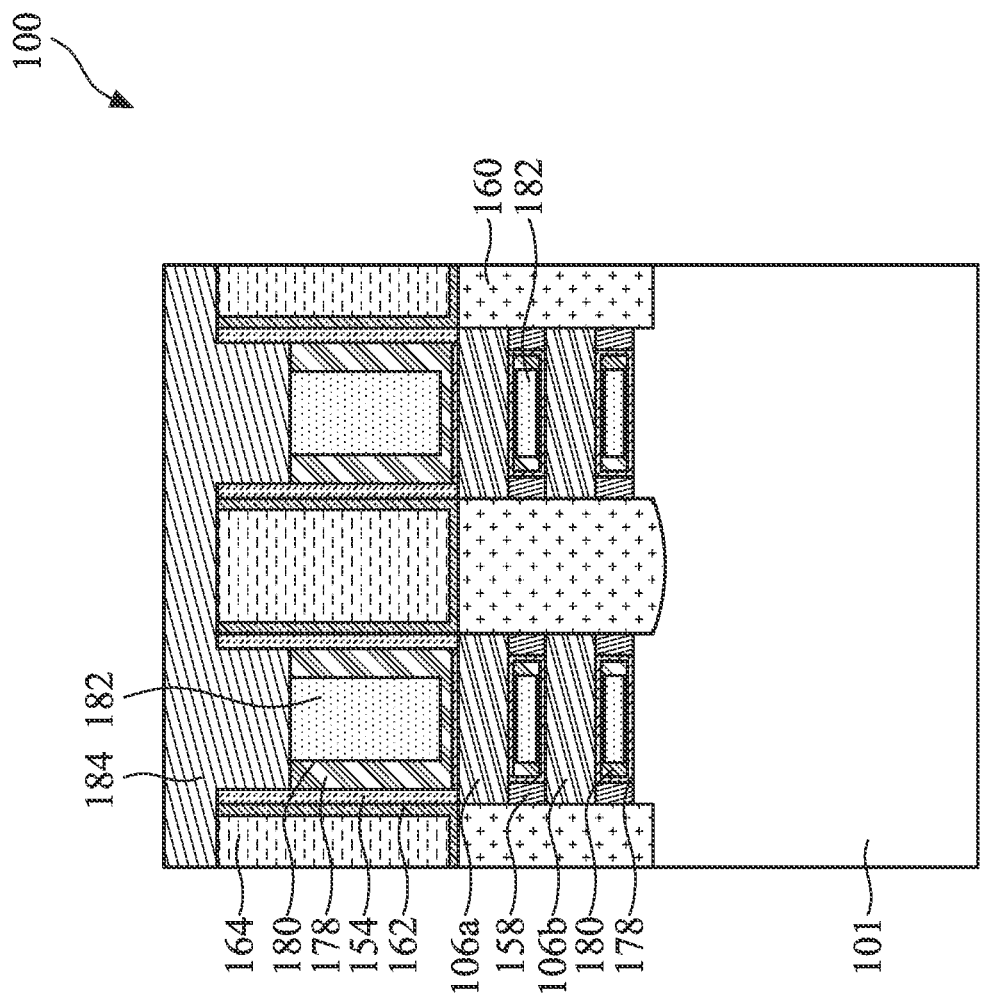
FIG. 23B is a cross-sectional side view of one of the various stages of manufacturing the semiconductor device structure taken along cross-section C-C of FIG. 12A in accordance with some embodiments.

FIG. 23A is a cross-sectional view of the semiconductor device structure 100 taken along cross-section B-B of FIG. 12A in accordance with some embodiments. FIG. 23B is a cross-sectional side view of the semiconductor device structure 100 taken along cross-section C-C of FIG. 12A in accordance with some embodiments. In FIG. 23A, the gate electrode layer 182 is recessed to the same level as the top surfaces 183, 185 of the second and fourth dielectric layers 128, 138. The recess of the gate electrode layers 182 may be performed by any suitable process, such as a dry etch, a wet etch, or a combination thereof. In some embodiments, the recess process may be a selective dry etch process that removes the gate electrode layer 182 but does not substantially affect the nitrogen-containing layer 152 (FIG. 12A), the spacer 154 (FIG. 12A), and the CESL 162 (FIG. 16A). As a result of the recess process, adjacent gate electrode layers 182 are separated, or cut-off, by the first and second dielectric features 130, 134.

Next, a mask 184 is formed on the exposed surfaces of the gate electrode layer 182, the first dielectric features 130, the second dielectric features 134, the ILD layers 164 (FIG. 22B), the CESLs 162 (FIG. 22B), the adjacent spacers 154 (FIG. 22B), the ILs 178, and the HK dielectric layers 180. The mask 184 may include or made of a semiconductor material, such as amorphous silicon, polysilicon, or the like, and may be formed by any suitable deposition technique, such as CVD, PECVD, MOCVD, FCVD, or MBE. In one embodiment, the mask 184 includes amorphous silicon.

Next, an opening 186 is formed in the mask 184, and a first dielectric material 188 is formed in the opening 186 and on the mask 184. The first dielectric material 188 has a bottom surface in contact with (and coplanar with) a top surface 187 of the second dielectric layer 128. The opening 186 exposes portions of the top surfaces of the first dielectric feature 130 (e.g., the top surfaces 183, 187 of the first and second dielectric layers 126, 128) and may be formed by a photolithography process and one or more etch processes. While not shown, two or more openings 186 may be formed in the mask 184 to expose surfaces of the first dielectric features 130 disposed in other regions. In any case, the openings 186 are predetermined so the gate electrode layers 182 between the openings 186, such as the gate electrode layers 182a, 182b (FIG. 24A), are to be electrically connected in subsequent processes.

The first dielectric material 188 may include the same material as the second dielectric layer 128 and may be formed by the same process as that of the first dielectric layer 126. In some embodiments, the first dielectric material 188 is a nitrogen-containing layer, such as a nitride. In some embodiments, the first dielectric material 188 includes SiN. The first dielectric material 188 formed over the mask 184 may be removed by using, for example, CMP, until a top surface 191 of the mask 184 is exposed. The top surface 191 of the mask 184 and a top surface 189 of the first dielectric material 188 are at the same level after the CMP, as shown in FIG. 23A.

Figure 24C:
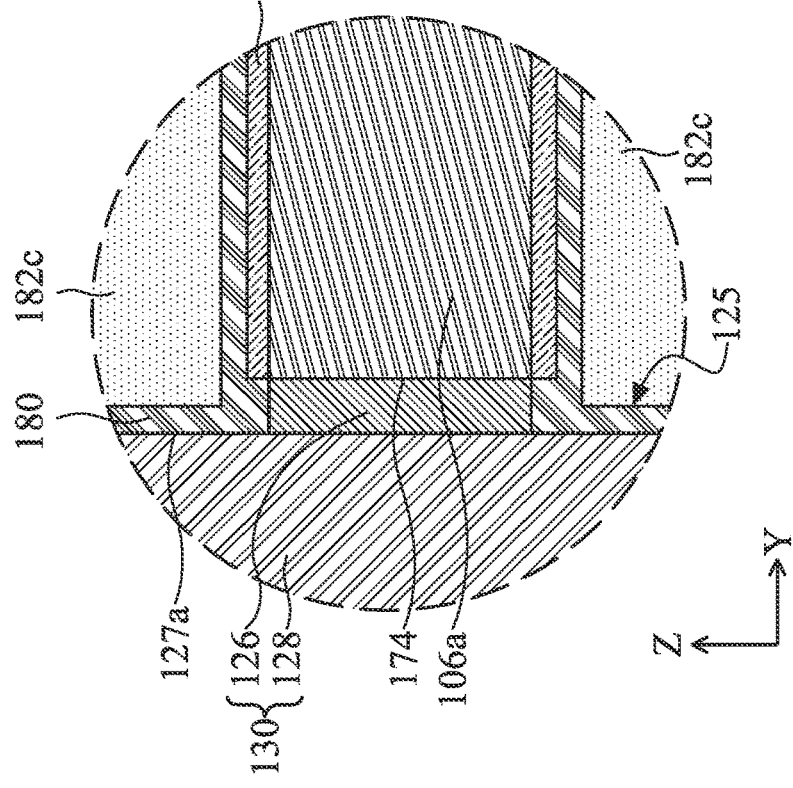
Figure 24D:
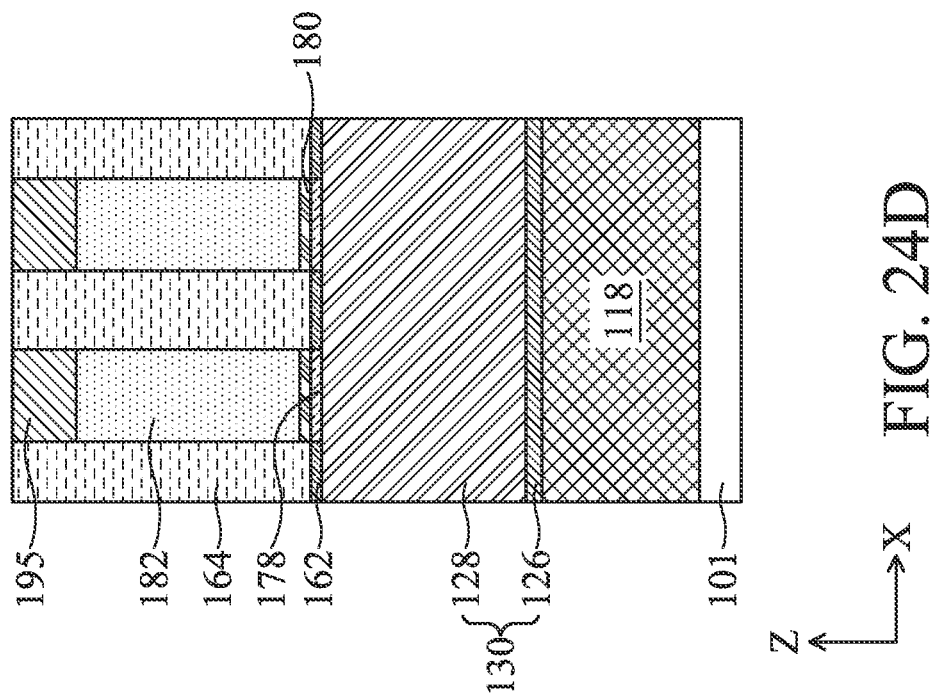
Figure 24E:
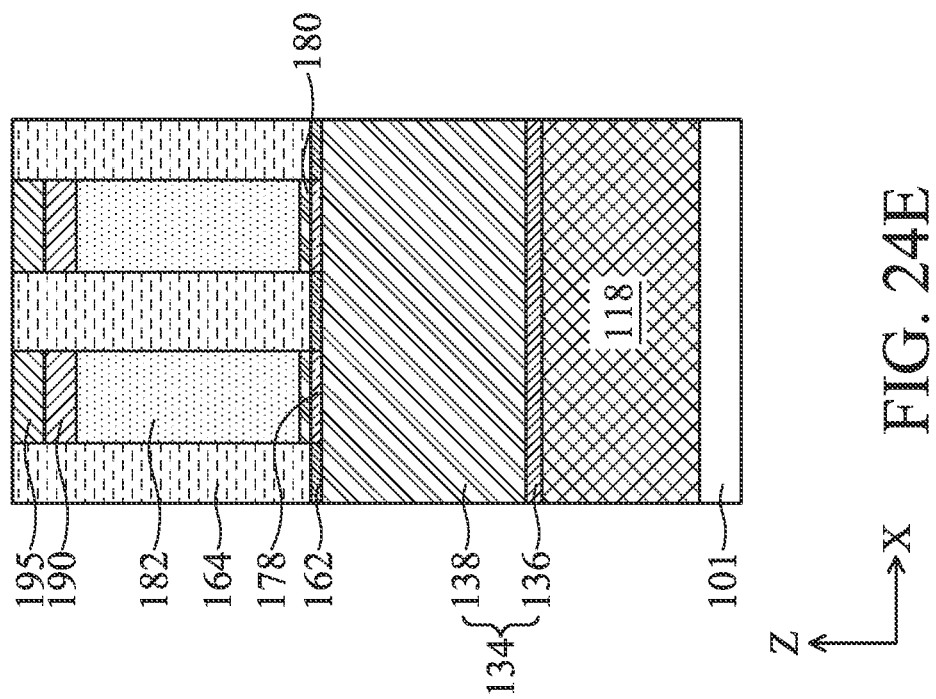

FIGS. 24A, 24D, and 24E are cross-sectional view of the semiconductor device structure 100 taken along cross-sections B-B, D-D, E-E of FIG. 12A, respectively, in accordance with some embodiments. FIG. 24B is an enlarged view of area 199 of a portion of the semiconductor device structure 100 shown in FIG. 24A according to some embodiments. FIG. 24C is an enlarged view of area 177 of a portion of the semiconductor device structure 100 shown in FIG. 24A according to some embodiments. In FIG. 24A, the mask 184 is removed and a conductive layer 190 is formed in the region where the mask 184 was removed. The mask 184 may be removed using any suitable process, such as a dry etch, a wet etch, or a combination thereof. In some embodiments, the removal process is a selective etch process that removes the mask 184 but does not remove the first dielectric material 188, the gate electrode layer 182, the first dielectric features 130, the second dielectric features 134, the ILD layers 164 (FIG. 23B), the CESLs 162 (FIG. 23B), the adjacent spacers 154 (FIG. 23B), the ILs 178, and the HK dielectric layers 180. The conductive layer 190 may include or be made of a material having one or more of Ru, Mo, Co, Ni. W, Ti, Ta, Cu, Al, TiN and TaN, and may be formed by any suitable process, such as PVD, ECP, or CVD. In some embodiments, the conductive layer 190 may have two or more layers made of the above-mentioned material to help adhesion of the conductive layer 190 to the layers underneath.

Once the mask 184 is removed, the conductive layer 190 is formed in the region where the mask 184 was removed. The conductive layer 190 may not form on the first dielectric material 188. The conductive layer 190 is in contact with the first dielectric material 188, the gate electrode layer 182, the first dielectric features 130, the second dielectric features 134, the ILD layers 164 (FIG. 23B), the CESLs 162 (FIG. 23B), the adjacent spacers 154 (FIG. 23B), and the HK dielectric layers 180. The bottom surface of the conductive layer 190 is coplanar with the top surfaces of the gate electrode layer 182 (e.g., 182b, 182c), the first dielectric features 130, and the second dielectric features 134. A planarization process may be performed so that a top surface 171 of the conductive layer 190 is at the same level with the top surface 189 (FIG. 23A) of the first dielectric material 188.

Next, a second dielectric material 192 is formed on the conductive layer 190 and the first dielectric material 188 until a desired thickness is reached. The second dielectric material 192 may include or be formed of the same material as the first dielectric material 188. In some embodiments, the second dielectric material 192 includes a nitride, such as SiN. The first dielectric material 188 and the second dielectric material 192 function as a self-aligned dielectric structure 195, as shown in FIG. 24A. The conductive layer 190 may provide a signal, such as an electrical current, to the gate electrode layer 182 located therebelow. In the embodiment shown in FIG. 24A, the signal can be provided to adjacent gate electrode layers 182 (e.g., gate electrode layers 182a, 182b) via the conductive layer 190. In such a case, a single signal sent to the gate electrode layer 182a or gate electrode layer 182b may control both nanosheet channel regions. Meanwhile, the self-aligned dielectric structure 195 cuts off the conductive layers 190 (i.e., conductive layers 190a, 190b are isolated from each other by the self-aligned dielectric structure 195). Since the first dielectric feature 130 also isolates the gate electrode layer 182b from the gate electrode layer 182c, a signal (e.g., an electrical current) sent to the conductive layer 190a and the gate electrode layers 182a, 182b in contact with the conductive layer 190a is not provided or shared with the conductive layer 190b and the gate electrode layer 182c on the other side of the self-aligned dielectric structure 195 (and the first dielectric feature 130).

In one embodiment shown in FIG. 24B, which is based on the embodiment shown in FIG. 19B, the first dielectric layer 126 has a first portion disposed between and in contact with the first semiconductor layer 106a and the second dielectric layer 128, and a second portion disposed between and in contact with the HK dielectric layer 180 and the second dielectric layer 128. In some embodiments, the IL 178 has a first HK portion 180a disposed between and in contact with the gate electrode layer 182 and the IL 178, a second HK portion 180b disposed between and in contact with the gate electrode layer 182 and the first dielectric layer 126, and a third HK portion 180c connecting the first HK portion 180a to the second HK portion 180b, and the third HK portion 180c is in contact with the first dielectric layer 126 and the IL 178. The first portion of the first dielectric layer 126 has the first thickness T1, and the second portion of the first dielectric layer 126 has the fifth thickness T5 that is less than the first thickness T1. The reduced fifth thickness T5 of the first dielectric layer 126 allows a surface (e.g., surface 125) of the gate electrode layer 182 to extend towards the second dielectric layer 128 and over a plane defined by the interface 174 between the first dielectric layer 126 and the first semiconductor layers 106a. The reduced fifth thickness T5 of the first dielectric layer 126 also allows the IL 178 and the HK dielectric layer 180 to extend towards the second dielectric layer 128 and over the plane defined by the interface 174.

In one embodiment shown in FIG. 24C, which is based on the embodiment shown in FIG. 19C, portions of the first dielectric layer 126 not in direct contact with the first semiconductor layers 106 (e.g., first semiconductor layers 106a, 106b) are removed. In such a case, a portion of the HK layer 180 (e.g., gate electrode layer 182c) is disposed between and in contact with the second dielectric layer 128 and the gate electrode layer 182. Likewise, the removal of the portions of the first dielectric layer 126 not in contact with the first semiconductor layers 106 allows a surface (e.g., surface 125) of the gate electrode layer 182 to extend towards the second dielectric layer 128 and over a plane defined by the interface 174 between the first dielectric layer 126 and the first semiconductor layers 106a. In either embodiment of FIG. 24B or 24C, the extended gate electrode layer 182 can provide greater surface coverage around the first semiconductor layer 106 and obtain better electrical control over the nanosheet channels (e.g., first semiconductor layers 106a, 106b).

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 by flipping over the semiconductor device structure 100, removing the substrate 101, and selectively connecting source or drain feature/terminal of the epitaxial S/D features 160 to a backside power rail (e.g., positive voltage VDD or negative voltage VSS) through the backside contacts. Depending on the application, the source or drain feature/terminal of the epitaxial S/D features 160 and the gate electrode layers 182 may be connected to a frontside power source.

The present disclosure provides a semiconductor device structure 100 including fork-like gate transistors (forksheet transistors) with improved gate control over the nanosheet channels. Due to the fact that no gate electrode layer 182 is presented between nanosheet channels and first dielectric feature 130, the first dielectric feature 130 and nanosheet channels (e.g., first semiconductor layers 106a, 106b) attached thereto form a fork-like gate transistor with a much tighter fin-to-fin spacing (e.g., second distance D2 in FIG. 5). This allows the deposition and patterning of the gate electrode layer from one side of the first semiconductor layers 106 and therefore a more simplified process for filling the gate electrode layer. The fork-like gate structure is disposed between and separated from adjacent nanosheet channels by second dielectric features 134, which also separate from the adjacent nanosheet channels by the gate electrode layer 182. Particularly, portions of a high-k dielectric layer on the first dielectric feature 130 are laterally recessed to allow greater surface coverage of the gate electrode layer 182 around the nanosheet channels. As a result, a better electrical control over the nanosheet channels is achieved.

An embodiment is a method for forming a semiconductor device structure. The method includes forming a first dielectric feature between first and the second fin structures, wherein each first and second fin structure includes first semiconductor layers and second semiconductor layers alternatingly stacked and in contact with the first dielectric layer. The method also includes removing the second semiconductor layers so that the first semiconductor layers of the first and second fin structures extend laterally from a first side and a second side of the first dielectric feature, respectively, trimming the first dielectric feature so that the first dielectric feature has a reduced thickness on both first and the second sides, and forming a gate electrode layer to surround each of the first semiconductor layers of the first and second fin structures.

Another embodiment is a method for forming a semiconductor device structure. The method includes forming a first dielectric feature between first and the second fin structures, wherein the first dielectric feature comprises a second dielectric layer having a first sidewall and a second sidewall opposing the first sidewall, and a first dielectric layer in contact with at least a portion of the first sidewall and at least a portion of the second sidewall. The method also includes removing the second semiconductor layers so that the first semiconductor layers of the first and second fin structures extend laterally from the first dielectric layer on either side of the first dielectric feature, and forming a gate electrode layer over exposed surfaces of the first dielectric layer, the second dielectric layer, and each of the first semiconductor layers of the first and second fin structures.

A further embodiment is a method for forming a semiconductor device structure. The method includes forming first, second and third fins from a substrate, wherein the first fin includes a first plurality of semiconductor layers, the second fin includes a second plurality of semiconductor layers, and the third fin includes a third plurality of semiconductor layers, and wherein each of the first, second, and third plurality of semiconductor layers comprises first semiconductor layers and second semiconductor layers. The method also includes forming a first dielectric feature between the first fin and the second fin, wherein the first dielectric feature has a first dielectric layer and a second dielectric layer disposed between and in contact with sidewalls of the first dielectric layer and the first and second plurality of semiconductor layers. The method includes forming a second dielectric feature between the second fin and the third fin, wherein the second dielectric feature has a third dielectric layer and a fourth dielectric layer in contact with sidewalls of the third dielectric layer. The method includes forming a sacrificial gate stack on a portion of the first, second, third fins, the first dielectric feature, and the second dielectric feature, wherein a portion of the first, second, third fins, first dielectric feature, and second dielectric feature are exposed. The method includes removing a portion of exposed portions of the first, second, and third fins not covered by the sacrificial gate stack. The method includes removing the sacrificial gate stack to expose portions of the first, second, and third fins. The method includes removing the second semiconductor layers of the first, second, and third plurality of semiconductor layers. The method includes removing portions of the second dielectric layer not in contact with the first semiconductor layers of the first and second plurality of semiconductor layers. The method further includes forming a gate electrode layer to surround at least three surfaces of the first semiconductor layers of the first, second, and third plurality of semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
    forming a first dielectric feature between first and the second fin structures, wherein each first and second fin structure includes first semiconductor layers and second semiconductor layers alternatingly stacked and in contact with the first dielectric layer;
    removing the second semiconductor layers so that the first semiconductor layers of the first and second fin structures extend laterally from a first side and a second side of the first dielectric feature, respectively;
    after removing the second semiconductor layers, trimming the first dielectric feature so that a portion of the first dielectric feature has a reduced thickness in a longitudinal direction on both first and the second sides; and
    forming a gate electrode layer to surround each of the first semiconductor layers of the first and second fin structures.

2. The method of claim 1, wherein the first dielectric feature comprises a first dielectric layer and a second dielectric layer surrounded by the first dielectric layer.

3. The method of claim 2, wherein trimming the first dielectric feature further comprises:
    removing the first dielectric layer not covered by the first semiconductor layers of the first and second fin structures to expose the second dielectric layer.

4. The method of claim 3, wherein trimming the first dielectric is performed so that the first dielectric layer between the second dielectric layer and the first semiconductor layers of the first and second fin structures remains substantially intact.

5. The method of claim 2, wherein trimming the first dielectric feature further comprises:
    removing a portion of the first dielectric layer not covered by the first semiconductor layers of the first and second fin structures so that the first dielectric layer on the second dielectric layer has a first thickness and the first dielectric layer between the second dielectric layer and the first semiconductor layers of the first and second fin structures has a second thickness greater than the first thickness.

6. The method of claim 2, wherein the first and second dielectric layers are formed of a material chemically different from each other.

7. The method of claim 1, wherein the gate electrode layer is deposited to cover exposed surfaces of the first dielectric feature.

8. The method of claim 1, further comprising:
    forming a second dielectric feature adjacent to the first side of the first dielectric feature; and
    forming a third dielectric feature adjacent to the second side of the first dielectric feature.

9. The method of claim 8, wherein the second dielectric feature and the third dielectric feature are separated from the first semiconductor layers of the first and second fin structures by the gate electrode layer.

10. A method for forming a semiconductor device structure, comprising:
    forming a first dielectric feature between first and the second fin structures, wherein each first and second fin structure comprises first semiconductor layers and second semiconductor layers alternatingly stacked and adjacent the first dielectric feature, and wherein the first dielectric feature comprises:
        a second dielectric layer having a first sidewall and a second sidewall opposing the first sidewall; and
        a first dielectric layer on the second dielectric layer and in contact with at least a portion of the first sidewall and at least a portion of the second sidewall;
    removing the second semiconductor layers so that the first semiconductor layers of the first and second fin structures extend laterally from the first dielectric layer on either side of the first dielectric feature; and
    forming a gate electrode layer on exposed surfaces of the first dielectric layer, the second dielectric layer, and each of the first semiconductor layers of the first and second fin structures.

11. The method of claim 10, wherein the gate electrode layer has a first portion extending across a first interface defined by the first dielectric layer and the first semiconductor layer.

12. The method of claim 11, wherein the gate electrode layer has a second portion surrounding each of the first semiconductor layers of the first and second in structures.

13. The method of claim 12, further comprising:
    forming a high-K (HK) dielectric layer over the second dielectric layer, the first dielectric layer, and the first semiconductor layers of the first and second fin structures.

14. The method of claim 13, further comprising:
    prior to forming the HK dielectric layer, forming an interfacial layer on the first semiconductor layers of the first and second fin structures.

15. The method of claim 13, wherein the first portion of the gate electrode layer is deposited so that a second interface defined by the HK dielectric layer and the first portion of the gate electrode layer is closer to the second dielectric layer than the first interface.

16. The method of claim 10, further comprising:
forming a second dielectric feature adjacent to a first side of the first dielectric feature, wherein the second dielectric feature is separated from the first semiconductor layers of the first fin structure by the gate electrode layer.

17. The method of claim 16, further comprising:
forming a third dielectric feature adjacent to a second side of the first dielectric feature, wherein the third dielectric feature is separated from the first semiconductor layers of the second fin structure by the gate electrode layer.

18. The method of claim 17, further comprising:
performing a planarization process so that top surfaces of the gate electrode layer, the first dielectric feature, the second dielectric feature, and the third dielectric feature are substantially co-planar.

19. A method for forming a semiconductor device structure, comprising:
forming first, second and third fin structures from a substrate, wherein the first fin includes a first plurality of semiconductor layers, the second fin includes a second plurality of semiconductor layers, and the third fin includes a third plurality of semiconductor layers, and wherein each of the first, second, and third plurality of semiconductor layers comprises first semiconductor layers and second semiconductor layers;
forming a first dielectric feature between the first fin and the second fin, wherein the first dielectric feature has a first dielectric layer and a second dielectric layer, and the second dielectric layer is disposed between and in contact with sidewalls of the first dielectric layer and the first and second plurality of semiconductor layers;
forming a second dielectric feature between the second fin and the third fin, wherein the second dielectric feature has a third dielectric layer and a fourth dielectric layer in contact with sidewalls of the third dielectric layer;
forming a sacrificial gate stack on a portion of the first, second, third fin structures, the first dielectric feature, and the second dielectric feature;
removing portions of the first, second, and third fin structures not covered by the sacrificial gate stack;
removing the sacrificial gate stack to expose the first, second, and third fin structures;
removing the second semiconductor layers of the first, second, and third plurality of semiconductor layers;
removing portions of the second dielectric layer not in contact with the first semiconductor layers of the first and second plurality of semiconductor layers such that the second dielectric layer on the first dielectric layer has a first thickness and the second dielectric layer between the first dielectric layer and the first semiconductor layers of the first and second fin structures has a second thickness greater than the first thickness; and
forming a gate electrode layer to surround at least three surfaces of the first semiconductor layers of the first, second, and third plurality of semiconductor layers.

20. The method of claim 19, further comprising:
forming a first conductive layer on the second dielectric feature and on the gate electrode layer surrounding the first semiconductor layers of the second and third plurality of semiconductor layers;
forming a second conductive layer on the gate electrode layer surrounding the first semiconductor layers of the first plurality of semiconductor layers; and
forming a dielectric material layer on the first dielectric feature, wherein the dielectric material layer electrically separates the first conductive layer and the second conductive layer.

* * * * *